(12) United States Patent
Sun et al.

(10) Patent No.: US 9,478,292 B2
(45) Date of Patent: Oct. 25, 2016

(54) READ OPERATION FOR A NON-VOLATILE MEMORY

(71) Applicant: Fusion-io, Inc., Salt Lake City, UT (US)

(72) Inventors: Hairong Sun, Superior, CO (US); Jea Hyun, South Jordan, UT (US); Robert Wood, Niwot, CO (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/525,076

(22) Filed: Oct. 27, 2014

(65) Prior Publication Data

US 2015/0117107 A1    Apr. 30, 2015

Related U.S. Application Data

(60) Provisional application No. 61/896,070, filed on Oct. 27, 2013.

(51) Int. Cl.

| G11C 16/10 | (2006.01) |
|---|---|
| G11C 11/56 | (2006.01) |
| G11C 16/14 | (2006.01) |
| G11C 16/22 | (2006.01) |
| G11C 16/34 | (2006.01) |

(52) U.S. Cl.
CPC ............ *G11C 16/10* (2013.01); *G11C 11/5635* (2013.01); *G11C 16/14* (2013.01); *G11C 16/225* (2013.01); *G11C 16/3495* (2013.01)

(58) Field of Classification Search
CPC ........ G11C 16/10; G11C 16/30; G11C 16/12
USPC ..................................................... 365/185.18
See application file for complete search history.

(56) References Cited

U.S. PATENT DOCUMENTS

| 2011/0063918 A1* | 3/2011 | Pei ..................... G11C 16/3418 365/185.18 |
|---|---|---|
| 2012/0066439 A1* | 3/2012 | Fillingim ............ G06F 11/3485 711/103 |

* cited by examiner

*Primary Examiner* — Jason Lappas
(74) *Attorney, Agent, or Firm* — Kunzler Law Group, PC

(57) ABSTRACT

Apparatuses, systems, and methods are disclosed for a read operation for a non-volatile memory. A method includes determining whether one or more non-volatile storage cells satisfy a predefined condition. A method includes preparing the one or more non-volatile storage cells for use prior to satisfying a read request from a storage client using the one or more non-volatile storage cells in response to determining that a predefined condition is satisfied.

15 Claims, 11 Drawing Sheets

```
0 0 1 0 1 0 1 1 0 0 1 0 0 0 1 1 0 1 0 1 0 1 1 1 0 0
1 0 1 0 1 1 0 0 1 0 0 1 1 1 1 0 1 0 1 0 1 1 1 0 0 1
0 1 0 1 1 0 0 1 0 0 1 0 1 1 0 0 1 1 0 1 0 1 0 1 1 1
0 0 1 0 1 0 1 1 0 0 1 0 0 1 0 0 1 1 0 1 0 1 0 1 1 1
0 0 1 0 1 0 1 1 0 0 1 0 0 1 0 0 1 1 0 1 0 1 0 1 1 0
0 0 0 0 1 0 1 0 1 0 1 1 1 1 1 1 1 1 1 1 1 1 1 1 1 1
1 1 1 1 1 1 1 1 1 1 1 1 1 1 1 1 1 1 1 1 1 1 1 1 1 1
1 1 1 1 1 1 1 1 1 1 1 1 1 1 1 1 1 1 1 1 1 1 1 1 1 1
1 1 1 1 1 1 1 1 1 1 1 1 1 1 1 1 1 1 1 1 1 1 1 1 1 1
1 1 1 1 1 1 1 1 1 1 1 1 1 1 1 1 1 1 1 1 1 1 1 1 1 1
1 1 1 1 1 1 1 1 1 1 1 1 1 1 1 1 1 1 1 1 1 1 1 1 1 1
1 1 1 1 1 1 1 1 1 1 1 1 1 1 1 1 1 1 1 1 1 1 1 1 1 1
```

READ OPERATION FOR A NON-VOLATILE MEMORY

CROSS-REFERENCES TO RELATED APPLICATIONS

This application claims the benefit of U.S. Provisional Patent Application No. 61/896,070 entitled "READ OPERATION FOR A NON-VOLATILE MEMORY," and filed on Oct. 27, 2013, for Hairong Sun et al., which is incorporated herein by reference.

FIELD

This disclosure relates to managing a non-volatile memory and more particularly relates to performing one or more read operations for a non-volatile memory in response to the non-volatile memory satisfying a predefined condition.

BACKGROUND

Certain types of non-volatile memory store data in storage cells. To program a storage cell from an erased state to a programmed state (e.g., from a binary one to a binary zero or the like), a controller for the storage cell may apply various electrical fields to a tunnel oxide layer of the storage cell, by applying a program voltage to a floating gate of the storage cell or the like. To erase a storage cell (e.g., from a binary zero to a binary one or the like), the controller may apply another electrical field to the tunnel oxide layer of the storage cell, by applying an erase voltage to the floating gate of the storage cell or the like.

Electrical fields in a tunnel oxide layer of a storage cell, however, may deteriorate when power is not applied. Therefore, when a device loses power and is powered down for a period of time, the stored electrical charge or read voltage level may gradually decrease. A change in the read voltage level of a storage cell may result in bit errors and other data integrity problems.

Additionally, many non-volatile memory devices may expect entire erase blocks to be programmed and may be designed to compensate for program disturb effects on one page due to programming of a neighboring page. However, powering down a memory device may result in an erase block being incompletely or partially programmed, with a portion of the erase block partially unused. A partially programmed erase block may have data errors in the last programmed page, because the neighboring page was never programmed but the device may still compensate for the expected disturb effects of the neighboring page.

SUMMARY

Methods are presented for a read operation for a non-volatile memory. In one embodiment, a method includes determining whether one or more non-volatile storage cells satisfy a predefined condition. In another embodiment, a method includes preparing the one or more non-volatile storage cells for use prior to satisfying a read request from a storage client using the one or more non-volatile storage cells in response to determining the one or more non-volatile storage cells satisfy a predefined condition.

Apparatuses are disclosed for a read operation for a non-volatile memory. In one embodiment, a status module is configured to detect that a non-volatile recording device is powered on after being powered down. In another embodiment, a read module is configured to perform one or more read operations on at least one page of the non-volatile recording device in response to the status module determining that the non-volatile recording device is powered on. In a further embodiment, a read module is configured to perform one or more read operations without transmitting data from one or more read operations to a storage client.

In one embodiment, an apparatus includes means for determining whether a set of non-volatile memory cells satisfy a retention condition. In another embodiment, an apparatus includes means for performing one or more read operations for the set of non-volatile memory cells in response to determining that the retention condition is satisfied. In a further embodiment, an apparatus includes means for bypassing an error-correcting code (ECC) decoder for data of the one or more read operations.

Computer program products are disclosed for a read operation for a non-volatile memory. In one embodiment, a computer program product includes a computer readable storage medium storing computer usable program code executable to perform operations. In one embodiment, an operation includes adjusting one or more read voltage thresholds for a non-volatile memory medium. In another embodiment, an operation includes performing one or more read operations for the non-volatile memory medium, the one or more read operations configured to adjust stored read voltage levels for the non-volatile memory medium relative to the adjusted one or more read voltage thresholds. In a further embodiment, an operation includes discarding data from the one or more read operations.

Systems are disclosed for a read operation for a non-volatile memory. In one embodiment, a system includes a non-volatile memory medium comprising a plurality of non-volatile memory cells. In another embodiment, a system includes a controller for a non-volatile memory medium. A controller, in certain embodiments, performs one or more read operations on a set of cells of a plurality of non-volatile memory cells of a non-volatile memory medium in response to determining that the set of cells satisfies a retention condition. A controller, in one embodiment, bypasses an error-correcting code (ECC) decoder for data of one or more read operations.

Reference throughout this specification to features, advantages, or similar language does not imply that all of the features and advantages that may be realized with the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the disclosure may be practiced without one or more of the specific features or advantages of a particular embodiment. In other instances, additional features and advantages may be recognized in certain embodiments that may not be present in all embodiments of the disclosure.

These features and advantages of the present disclosure will become more fully apparent from the following description and appended claims, or may be learned by the practice of the disclosure as set forth hereinafter.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings, in which.

DETAILED DESCRIPTION

Figure 1:
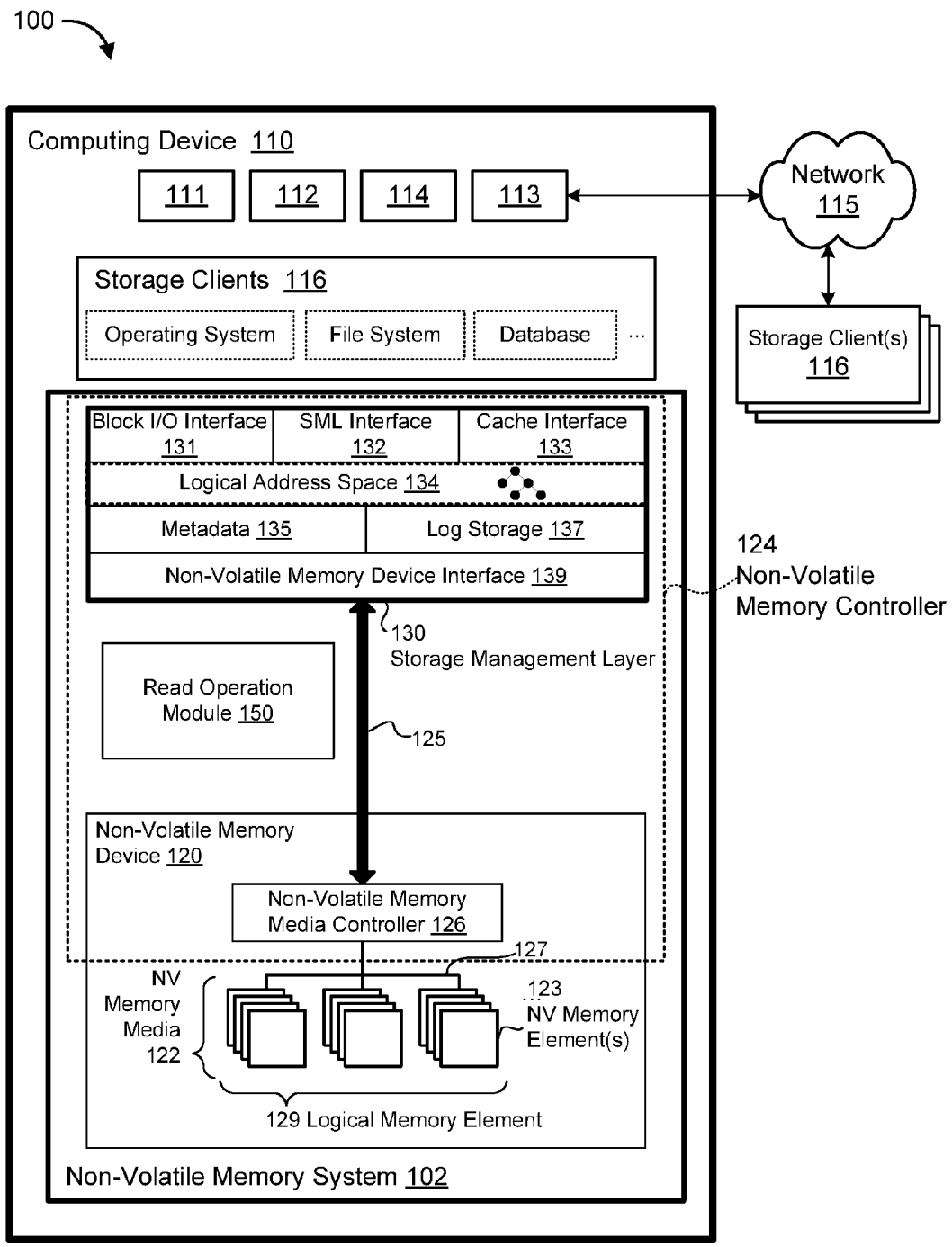
FIG. 1 is a schematic block diagram of one embodiment of a non-volatile memory system comprising a read operation module.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising a read operation module 150. The read operation module 150 may be part of and/or in communication with one or more of a non-volatile memory controller 124, a non-volatile memory media controller 126, a device driver or storage management layer (SML) 130, or the like. The read operation module 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the read operation module 150 may be embodied as one or more computer readable instructions stored on the non-transitory storage media 114.

In certain embodiments, as the non-volatile memory media controller 126 causes the non-volatile memory media 122 to be programmed and erased by applying various program and erase voltages to floating gates of the storage cells, or causing them to be applied using storage commends (e.g., write or program commands, erase commands, read commands), electrons may become trapped in a tunnel oxide layer of the storage cells, and may build up over time. Depending on a configuration of the erase operation used, the amount of trapped electrons may vary.

However, in response the non-volatile memory media 122 losing power, these trapped electrons may gradually be detrapped, which may cause the stored voltage level of one or more cells of the non-volatile memory media 122 to slowly leak or decrease. A decrease in a stored voltage of one or more storage cells of the non-volatile memory media 122 may result in bit errors, or other data inconsistencies because the stored voltage level may decrease beyond a predefined read voltage threshold value, crossing abode boundaries.

Furthermore, the computing device 110 and/or the non-volatile memory device 120, in the depicted embodiment, may be powered off before each page of an erase block has been programmed, resulting in a partially programmed erase block. Therefore, expected program disturb effects that would normally occur from programming neighboring storage cells in an erase block may not occur. The non-volatile memory media 122 may be designed to compensate for these program disturb effects, which may normally cause storage cells of a previously programmed page to be programmed a small amount by the programming of the next, adjacent, neighboring page. Powering off the non-volatile memory device 120 before each page of an erase block has been programmed may therefore result in bit errors or other data problems, in the last programmed page or the like.

The non-volatile memory system 102, in the depicted embodiment, includes the read operation module 150. The read operation module 150, in certain embodiments, may perform one or more read operations on storage cells of the non-volatile memory media 122 to intentionally cause read disturb effects in the storage cells and/or in adjacent storage cells, to counteract the effect of electron detrapping due to the memory device 120 being powered off/powered down, being powered down or unpowered for at least a predetermined amount of time, or due to another predefined condition. Since read operations of the read operation module 150 are intended to affect a stored read voltage level of the associated storage cells, of physically adjacent storage cells, or the like and the data read by the operation may be irrelevant, the read operations may comprise "dummy" read operations, "pseudo" read operations, "spoof" read operations, or the like and the read data may be discarded or ignored.

The read operation module 150 may be configured to determine whether one or more storage cells of the non-volatile memory device 120 (e.g., a page, a word line, an erase block, and/or the non-volatile memory media 122) satisfy a predefined condition. Predefined conditions may include, the computing device 110 and/or the memory device 120 being powered down, the computing device 110 and/or the memory device 120 being powered up, the computing device 110 and/or the memory device 120 being unpowered for at least a predefined amount of time, the memory device 120 satisfying a temperature threshold, a partially written erase block condition for the memory device 120, one or more non-volatile storage cells satisfying an error rate threshold, and/or another condition associated with or otherwise indicating that electron detrapping or storage cell charge loss may have occurred. Predefined conditions are described in greater detail below with regard to FIG. 2.

In response to determining that a predefined condition is satisfied, the read operation module 150 may perform one or more read operations on the storage cells (e.g., a page, a word line, an erase block, and/or the non-volatile memory media 122). Due to read disturb effects adding electrons or programming neighboring storage cells, performing one or more read operations on non-volatile storage cells may reduce a bit error rate, may raise a read voltage level that has been decreased by detrapping, may recondition, correct, or otherwise enhance operation of non-volatile storage cells, as described in greater detail below. Because data resulting from the one or more read operations may be irrelevant for the read operation module 150 to cause read disturb effects, the read operation module 150, in certain embodiments, may be configured to discard or ignore data resulting from the read operations. In one embodiment, the read operation module 150 may bypass an error-correcting code (ECC) decoder or other processing steps for the data, increasing an efficiency of the read operations.

In one embodiment, a predefined condition that triggers the read operation module 150 to perform one or more read operations may include a use threshold. As used herein, a predefined condition or use threshold may track, measure, or relate to a state, history, condition, characteristic, age, degradation, error rate, detrapping, or another property of storage cells of the non-volatile memory media 122. A use threshold may also include or be referred to as a degradation threshold, an age threshold, a condition threshold, an error threshold, a detrapping threshold, or the like, depending on the type of use threshold. In various embodiments, a use threshold may be set relative to and/or describe the non-volatile memory device 120 being powered off, a program/erase count, a media characteristic, an amount of time since an erase operation, an error rate (e.g., a raw bit error rate (RBER), an uncorrectable bit error rate (UBER), or the like), an age, an amount of time the non-volatile memory device 120 has been powered on, an amount of time the non-volatile memory device 120 has been unpowered, operating above a temperature threshold, or another property of storage cells of the non-volatile memory media 122.

A predefined condition or use threshold may indicate or be associated with a likelihood that stored read voltage levels of a set of storage cells may have drifted or changed since being programmed, and may not be within the intended read voltage threshold values or abodes, causing bit errors. Predefined conditions, such as, but not limited to, a use threshold, an age threshold, a condition threshold, a detrapping threshold, and a degradation threshold are not mutually exclusive. In one embodiment, a predefined condition may incorporate a combination of multiple thresholds.

For example, a predefined condition may include a program/erase count or other age metric, or the like. The read operation module 150 may use a single use threshold for all of the non-volatile memory media 122; may use different use thresholds for different non-volatile memory elements 123 (e.g., chips, banks, dies, die planes, or the like); may use different use thresholds for different storage regions, such as logical or physical erase blocks, pages, error-correcting code (ECC) chunks, or the like; or may use another granularity for one or more use thresholds or other predefined conditions. Therefore, a predefined condition that triggers the read operation module 150 to perform one or more read operations may differ based on one or more of a page architecture, an addressing scheme, a physical cell geometry, or the like, for storage cells of the non-volatile memory device 120.

In one embodiment, the read operation module 150 may be configured to determine whether one or more non-volatile storage cells satisfy a predefined condition based on monitored characteristics, statistics, states, or properties of the non-volatile memory media 122, such as those described above with regard to the use threshold. In a further embodiment, a manufacturer, vendor, distributor, designer, or the like of the non-volatile memory device 120 may determine, program, and/or hard code one or more use thresholds or other predefined conditions for the non-volatile memory media 122. In a further embodiment, a use threshold or other predefined condition may be provided by and/or selectable by a storage client 116, as part of a storage request, as a setting of a control register, as an initial setting, during partitioning, or the like.

In one embodiment, the read operation module 150 may identify a predefined condition for either allocated, used storage cells or for deallocated storage cells. In certain embodiments, the read operation module 150 may not immediately perform one or more read operations on the non-volatile memory media 122 in response to determining that a predefined condition has occurred. The read operation module 150 may perform one or more read operations later in time, lazily, opportunistically, as a background process, or the like. In one embodiment, the read operation module 150 may be configured to just perform read operations on used, allocated storage cells that store data. In another embodiment, the read operation module 150 may perform a read operation on a deallocated physical block that currently does not store data. For example, in response to the computing device 110 being powered on, having been powered down for at least a predefined period of time, or the like, the read operation module 150 may perform one or more read operations on one or more entire erase blocks, on the entire non-volatile memory media 122, or the like, regardless of whether the erase blocks currently store valid data.

The read operation module 150 may monitor or track operations for the non-volatile memory device 120 and may determine that an erase block or other set of storage cells may have decreased stored voltage levels due to detrapping or has met some other predefined condition (e.g., has been powered off, has been unpowered for at least a predetermined amount of time, has an erase block that was only partially programmed with data, or the like). The read operation module 150 may perform one or more read operations for a set of non-volatile storage cells in response to determining that the storage cells have satisfied one or more predefined conditions. In another embodiment, the read operations of the read operation module 150 may bring one or more read voltage levels back within an originally selected read threshold boundary or abode by programming or adding electrons to storage cells using read disturb effects. In one embodiment, the read operation module 150 may perform one or more reads on all or substantially all storage cells of the non-volatile memory media 122 (e.g., reading page by page as a background process or the like). In a further embodiment, the read operation module 150 may target a specific subset of storage cells of the non-volatile memory media 122 for read operations (e.g., reading from a page neighboring or adjacent to the last programmed page in a partially filled erase block or the like).

In one embodiment, the read operation module 150 may comprise executable software code, such as a device driver, SML 130, or the like, stored on the computer readable storage media 114 for execution on the processor 111. In another embodiment the read operation module 150 may comprise logic hardware of one or more non-volatile memory devices 120, such as a non-volatile memory media controller 126, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the read operation module 150 may include a combination of both executable software code and logic hardware.

In one embodiment, the read operation module 150 is configured to receive storage requests from the SML 130 via a bus 125 or the like. The read operation module 150 may be further configured to transfer data to/from the SML 130 and/or storage clients 116 via the bus 125. Accordingly, the read operation module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the read operation module 150 may receive storage requests as an API call from a storage client 116, as an IO-CTL command, or the like. The read operation module 150 is described in greater detail below with regard to FIGS. 2 and 3.

According to various embodiments, a non-volatile memory controller 124 comprising the read operation module 150 may manage one or more non-volatile memory devices 120. The non-volatile memory device(s) 120 may comprise recording, memory, and/or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, erase blocks, sectors, blocks, collections or sets of physical storage locations (e.g., logical pages, logical erase blocks, described below), even pages or word lines, odd pages or word lines, or the like.

The non-volatile memory controller 124 may comprise an SML 130, which may present a logical address space 134 to one or more storage clients 116. One example of an SML is the Virtual Storage Layer® of Fusion-io, Inc. of Salt Lake City, Utah. Alternatively, each non-volatile memory device 120 may comprise a non-volatile memory media controller 126, which may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML 130 may maintain metadata 135, such as a forward index, to map logical addresses of the logical address space 134 to media storage locations on the non-volatile memory device(s) 120. The SML 130 may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML 130 may map logical addresses to physical data resources of any size and/or granularity, which may or may not correspond to the underlying data partitioning scheme of the non-volatile memory device(s) 120. For example, in some embodiments, the non-volatile memory controller 124 is configured to store data within logical memory units that are formed by logically combining a plurality of physical memory units, which may allow the non-volatile memory controller 124 to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (e.g., each non-volatile memory element being accessible in parallel). As used herein, a logical memory division refers to a set of two or more physical memory divisions, each physical memory division on a respective non-volatile memory element in the respective logical memory element.

The logical address space 134 presented by the SML 130 may have a logical capacity, which may correspond to the number of available logical addresses in the logical address space 134 and the size and/or granularity of the data referenced by the logical addresses. For example, the logical capacity of a logical address space 134 comprising $2^{32}$ unique logical addresses, each referencing 2048 bytes (2 KiB) of data may be $2^{43}$ bytes. As used herein, a kibibyte (KiB) refers to 1024 bytes. In some embodiments, the logical address space 134 may be thinly provisioned. As used herein, a "thinly provisioned" logical address space 134 refers to a logical address space 134 having a logical capacity that exceeds the physical capacity of the underlying non-volatile memory device(s) 120. For example, the SML 130 may present a 64-bit logical address space 134 to the storage clients 116 (e.g., a logical address space 134 referenced by 64-bit logical addresses), which may exceed the physical capacity of the underlying non-volatile memory devices 120. The large logical address space 134 may allow storage clients 116 to allocate and/or reference contiguous ranges of logical addresses, while reducing the chance of naming conflicts. The SML 130 may leverage the any-to-any mappings between logical addresses and physical storage resources to manage the logical address space 134 independently of the underlying physical storage devices 120. For example, the SML 130 may add and/or remove physical storage resources seamlessly, as needed, and without changing the logical addresses used by the storage clients 116.

The non-volatile memory controller 124 may be configured to store data in a contextual format. As used herein, a contextual format refers to a self-describing data format in which persistent contextual metadata is stored with the data on the physical storage media 122. The persistent contextual metadata provides context for the data with which it is stored. In certain embodiments, the persistent contextual metadata uniquely identifies the data with which the persistent contextual metadata is stored. For example, the persistent contextual metadata may uniquely identify a sector or block of data owned by a storage client 116 from other sectors or blocks of data owned by the storage client 116. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data.

The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, or the like), data size and/or range, and the like. The contextual data format may comprise a packet format comprising a data segment and one or more headers. Alternatively, a contextual data format may associate data with context information in other ways (e.g., in a dedicated index on the non-volatile memory media 122, a memory division index, or the like).

In some embodiments, the contextual data format may allow data context to be determined and/or reconstructed based upon the contents of the non-volatile memory media 122, and independently of other metadata, such as the arbitrary, any-to-any mappings discussed above. Since the media location of data is independent of the logical address of the data, it may be inefficient or impossible to determine the context of data based solely upon the media location or media address of the data. Storing data in a contextual format on the non-volatile memory media 122 may allow data context to be determined without reference to other metadata. For example, the contextual data format may allow the metadata to be reconstructed based only upon the contents of the non-volatile memory media 122 (e.g., reconstruct the any-to-any mappings between logical addresses and media locations).

In some embodiments, the non-volatile memory controller 124 may be configured to store data on one or more asymmetric, write-once media 122, such as solid-state storage media. As used herein, a "write once" storage medium refers to a storage medium that is reinitialized (e.g., erased) each time new data is written or programmed thereon. As used herein, an "asymmetric" storage medium refers to a storage medium 122 having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media).

The memory media 122 may be partitioned into memory divisions that can be erased as a group (e.g., erase blocks) in order to, inter alia, account for the asymmetric properties of the media 122 or the like. As such, modifying a single data segment in-place may require erasing the entire erase block comprising the data, and rewriting the modified data to the erase block, along with the original, unchanged data. This may result in inefficient "write amplification," which may excessively wear the media 122. Therefore, in some embodiments, the non-volatile memory controller 124 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

The non-volatile memory controller 124 may comprise one or more processes that operate outside of the regular path for servicing of storage operations (e.g., the "path" for performing a storage operation and/or servicing a storage request). As used herein, the "path for servicing a storage request" or "path for servicing a storage operation" (e.g., also referred to as the "critical path") refers to a series of processing operations needed to service the storage operation or request, such as a read, write, modify, or the like. The path for servicing a storage request may comprise receiving the request from a storage client 116, identifying the logical addresses of the request, performing one or more storage operations on non-volatile memory media 122, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller 124 comprises a groomer, which is configured to reclaim memory divisions (e.g., logical or physical erase blocks) for reuse, using a garbage collection or other storage capacity recovery process. The write out-of-place paradigm implemented by the non-volatile memory controller 124 may result in obsolete or invalid data remaining on the non-volatile memory media 122. For example, overwriting data X with data Y may result in storing Y on a new memory division (e.g., rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media 122 may accumulate a significant amount of invalid data.

A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller 124 may be further configured to store data in a log format. As described above, a log format refers to a data format that defines an ordered sequence of storage operations performed on a non-volatile memory media 122. In some embodiments, the log format comprises storing data in a predetermined sequence of media addresses of the non-volatile memory media 122 (e.g., within sequential pages and/or erase blocks of the media 122). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller 124, using the log storage module 137 described below or the like, may maintain a current append point at a media address of the non-volatile memory device 120. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller 124 may identify the "next" available memory division (e.g., the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media 122, and independently of other metadata. As discussed above, invalid data may not be removed from the non-volatile memory media 122 until the memory division comprising the data is reclaimed. Therefore, multiple "versions" of data having the same context may exist on the non-volatile memory media 122 (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

The storage management layer 130 may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The one or more non-volatile memory devices 120 may include different types of non-volatile memory devices including, but not limited to: solid-state storage devices, hard drives, SAN storage resources, or the like. The one or more non-volatile memory devices 120 may comprise one or more respective non-volatile memory media controllers 126 and non-volatile memory media 122. As illustrated in FIG. 1, The SML 130 may provide access to the one or more non-volatile memory devices 120 via a traditional block I/O interface 131. Additionally, the SML 130 may provide access to enhanced functionality (e.g., a large, virtual address space 134) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations the on one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 124 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 124 comprises one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change RAM (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on and/or read data from the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (e.g., a page or word line of each element of non-volatile memory media 122).

The non-volatile memory controller 124 may comprise an SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (e.g., through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
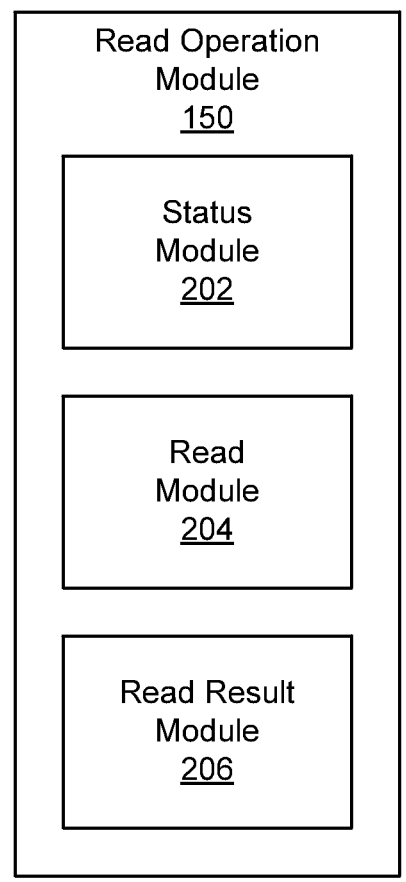
FIG. 2 is a schematic block diagram illustrating one embodiment of a read operation module.

FIG. 2 is a schematic block diagram illustrating one embodiment of the read operation module 150. In the depicted embodiment, the read operation module 150 includes a status module 202, a read module 204, and a read result module 206.

In one embodiment, the status module 202 may monitor, estimate, gauge, measure, or otherwise determine whether one or more storage cells of the non-volatile memory media 122 satisfy a predefined condition. For example, the status module 202 may monitor a retention condition, a use of, a degradation of, and/or operations on a set of non-volatile storage cells. As used herein, a set of storage cells may comprise one or more of a single storage cell, a physical page, a logical page, a plurality of pages, a physical erase block, a logical erase block, a plurality of erase blocks, a die, a die plane, a chip, a bank, a non-volatile memory device 120, or another set of one or more storage cells of the non-volatile memory media 122.

A retention condition, as used herein, may comprise a factor, characteristic, circumstance, state, indicator, and/or trigger that indicates or is associated with a change in a stored read voltage level, such as a decrease in a stored read voltage level over time. The status module 202 may determine whether one or more storage cells, a page, an erase block, the non-volatile memory device 120, or the like satisfy a predefined retention condition using a predefined mathematical equation; a lookup table; based on a signal or other trigger from another module or device, such as the nom-volatile memory media controller 126, the SML 130, a storage client 116, or the like; by comparing a monitored or measured value to a predefined threshold (e.g., is the monitored value greater than the threshold, is the monitored value less than the threshold, is the monitored value equal to the threshold); or by performing another action to determine whether one or more storage cells satisfy a predefined retention condition.

A retention condition may include one or more predefined levels or thresholds which the status module 202 may use to determine whether a set of storage cells satisfy the retention condition. A retention condition may include use metrics, degradation thresholds, or the like. The status module 202 may use other factors to indicate or estimate a set of storage cells' capacity to store or retain a stored read voltage level over a period of time without power.

In one embodiment, a retention condition may include one or more storage cells, the non-volatile memory device 120, the computing device 110, or the like being shut down or powered down for a period of time, being powered on or powered up after being powered down, or the like. Being powered down, powered off, shutdown, restarted, unpowered, or the like, as used herein, comprises an intentional or unintentional loss of power to at least a portion of the host computing device 110 and/or the non-volatile memory device 120. A power down, power off, shutdown, or restart may comprise a system reboot, restart, reset, or shutdown event; a power fault, power loss, or power failure event; or another interruption or reduction of power.

As described above, the stored read voltage level of a non-volatile storage cell, such as NAND flash or the like, may change, decrease, or sag, over time without power. In certain embodiments, the status module 202 may determine that a set of storage cells satisfies a predefined condition if there has been any power down or shutdown. In a further embodiment, the status module 202 may determine that a set of storage cells satisfies a predefined condition in response to the storage cells, the non-volatile memory device 120, and/or the computing device 110 being powered down or unpowered for at least a predefined period of time (e.g., a predefined number of seconds, minutes, hours, days, weeks, or the like). For example, the status module 202 may compare a current time to a timestamp of a shutdown indicator or other metadata stored in the non-volatile memory media, to a timestamp for most recently written data in the non-volatile memory media 122 (e.g., at an append point of a sequential, log-based writing structure or the like) to determine how long the non-volatile memory device has been unpowered, powered down or off, or the like.

The status module 202, in one embodiment, may determine or detect that a set of storage cells, the non-volatile memory device 120, the computing device 110, or the like has been powered down, has been powered on or powered up after being powered down, has been unpowered for at least a predetermined period of time, or the like based on an alert or message from another module or entity, such as the host computing device 110, a storage client 116, the SML 130, the non-volatile memory controller 124, the non-volatile memory media controller 126, or the like. In a further embodiment, the status module 202 may determine or detect that a set of storage cells, the non-volatile memory device 120, the computing device 110, or the like has been powered down, has been powered on or powered up after being powered down, has been unpowered for at least a predetermined period of time, or the like by scanning or reading metadata stored on the non-volatile memory media 122 indicating that a power-down, power-off, shutdown, or the like has occurred. For example, upon detecting a power loss, a decrease in available power, or the like, the status module 202, the host computing device 110, a storage client 116, the SML 130, the non-volatile memory controller 124, the non-volatile memory media controller 126, or the like may write a shutdown indicator or other metadata to a predefined location in the non-volatile memory media 122, such as an append point of a sequential, log-based writing structure, a reserved logical address, or the like, which the status module 202 may retrieve and process once power has been restored, the computing device 110 and/or non-volatile memory device 120 have been powered on, or the like.

In another embodiment, the status module 202 may determine or detect that a power source for the non-volatile memory device 120 has failed to supply electric power above a predefined threshold, has begun providing power after having powered down, has been unpowered for at least a predetermined period of time, or the like. In one embodiment, power above the predefined threshold is sufficient for the non-volatile memory device 120 to operate. The predefined threshold, in a further embodiment, is set at or above an insufficient power level for the non-volatile memory device 120. Insufficient power is power that does not meet the requirements for the non-volatile memory device 120. Power with a high AC or harmonic component when DC is expected and a voltage or current level that is too low are examples of insufficient power. In certain embodiments, the non-volatile memory device 120, the media controller 126, or the like may be configured to automatically accept or otherwise draw power from a secondary power supply (e.g., one or more capacitors, batteries, or the like) when power from a primary power source falls below the predefined threshold, to allow certain storage operations to complete, to allow metadata to be written (e.g., the shutdown indicator or other metadata described above).

A primary power source for the non-volatile memory device 120, in one embodiment, is a source of power that the non-volatile memory device 120 uses during normal operation and which provides a substantially continuous supply of power that is not unexpectedly interrupted during normal operation. For example, in typical embodiments, the host computer device 110 to which the non-volatile memory device 120 is attached is the primary power source and provides power through the motherboard, such as through a bus or slot connection such as PCI, PCIe, AGP, or the like, or through an external port such as a USB port, a FireWire port, an eSATAp port, or the like. In another embodiment, the primary power source may comprise a standard electrical outlet.

In one embodiment, the status module 202 monitors a power connection directly to determine when the computing device 110 and/or the non-volatile memory device 120 is powering down, has powered on after powering down, has been unpowered for at least a predetermined period of time, or the like. For example, the status module 202 may include a power sensor, a current sensor, and/or another electrical sensor with which to determine whether the non-volatile memory device 120 is receiving sufficient external power, is powering up, is powering down, or the like.

In certain embodiments, other changes to a storage cell's stored read voltage level may occur for various reasons, with or without power, and this disclosure is not limited in this regard. Therefore, a retention condition, in various embodiments, may include other potential effects on a stored read voltage level.

In one embodiment, a predefined condition for the status module 202 may comprise the computing device 110, the non-volatile memory device 120, and/or the non-volatile memory media 122 being powered down or off, being powered up or on after being powered down, being unpowered for at least a predetermined period of time, or the like. Powering down the computing device 110, the non-volatile memory device 120, or the like before each page of an erase block has been programmed with data may result in the media controller 126 only programming a subset of the storage cells in the erase block, referred to herein as partial or incomplete programming of an erase block. Partially or incompletely programming an erase block with data may result in incorrect read voltage levels for one or more pages of storage cells of the erase block as previously described, because read voltage thresholds, program voltage thresholds, program verify voltage thresholds, or the like may be defined for the storage cells to compensate for expected effects of a program disturb due to a programming of neighboring or adjacent pages of storage cells. In the case of partially programmed erase blocks, the last programmed page may not have received the expected program disturb effects and may therefore store read voltage levels that are lower than intended.

A program disturb may occur when programming storage cells in an erase block. As described herein, a program disturb effect may include an effect on stored read voltage levels of one or more storage cells (e.g., a page or word line) of an erase block caused by programming one or more neighboring or adjacent storage cells (e.g., a page or word line) in the erase block. A program disturb effect may increase or decrease a stored read voltage level for the neighboring cells. In one embodiment, programming a first page in an erase block may cause an increase in voltage levels for cells in a neighboring or adjacent page. In a further embodiment, depending on an architecture, a page addressing scheme, a physical cell geometry, or the like for storage cells of the non-volatile memory media 122, a program disturb may affect storage cells with a predetermined relationship to the programmed storage cells, such as a previous page (e.g., a page with a page address or identifier decremented by one) or the like. A program disturb effect may be determined based on a memory architecture, a physical cell geometry, an arrangement of storage cells, distances between storage cells, a programming voltage level, storage cell material, or the like.

A memory device manufacturer may account for these program disturb effects with one or more characteristics or thresholds of a programming process (e.g., an incremental step pulse programming process or the like) to compensate for the expected effects of program disturb. For example, storage cells of a page may be programmed to lower ranges of the respective abodes, with the expectation that a program disturb from programming a subsequent page will increase the stored read voltage levels to place them toward a center of the respective abodes.

In certain embodiments, compensating for the effects of program disturb may result in more reliable read voltage levels for the storage cells in the memory media 122, at least when each page of an erase block is programmed. However, in one embodiment, if the computing device 110 and/or the non-volatile memory device 120 are powered down or off before each page of an erase block has been programmed, at least the last programmed page may not undergo any program disturb effects, leaving the storage cells of the last programmed page with stored read voltage levels that are below optimal levels, in a lower range of their respective abodes, or the like. Partially or incompletely programming an erase block may result in higher error rates, at least for a last programmed page.

To reduce this error rate, rectify an incomplete or partially programmed erase block, or the like, upon power on or power up, a set of storage cells may satisfy a predefined condition for the status module 202 when an erase block has been partially or incompletely programmed with data before a shutdown or power down. As described below, the read module 204 may perform one or more read operations on storage cells of an erase block that has been incompletely or partially programmed with data, such as the entire erase block, a last programmed page, a page adjacent to or neighboring a last programmed page, or the like to cause a read disturb effect for at least a subset of storage cells of the erase block, thereby increasing one or more stored read voltage levels.

In a further embodiment, a predefined retention condition may include a predefined program/erase count threshold for one or more storage cells, an age threshold, an up-time threshold, an error rate threshold, the non-volatile memory device being powered on, the non-volatile memory device being powered off or unpowered for at least a predefined period of time, a set of storage cells storing data, a set of storage cells not storing data, a storage capacity recovery event (e.g., garbage collection or grooming) for a set of storage cells, or the like. A degradation of an erase block may also include the presence of trapped electrons in a tunnel oxide layer, the detrapping of electrons from a tunnel oxide layer without power, an error rate, or the like. Therefore, a "retention" and a "degradation" condition or threshold are not mutually exclusive and a predefined condition may include one or many of the predefined conditions described.

One or more of the predefined conditions discussed may be a result of environment effects on the storage cell, or the like. Loss of power, power up, operation above a temperature threshold, a period of time unpowered, a predefined number of program/erase cycles, another use threshold, or the like, may affect the stored read voltage value for one or more storage cells. In another embodiment, results from these effects may result in bit errors, read retries, or other data inconsistencies. In one embodiment, the predefined condition may include shifts in one or more read voltage levels for the non-volatile storage cells.

In another embodiment, the status module 202 may measure a program/erase count of an erase block or other set of storage cells. The status module 202 may count the number of times an erase block is programmed and erased. Flash based storage devices have limited endurance and program/erase cycles may gradually degrade the storage cells, may lead to trapped electrons in a tunnel oxide layer of the storage cells, or the like. Over many program/erase cycles, the storage cells may have an increasing error rate, may fail to retain data, may experience more changes in stored read voltage levels, or the like. In one embodiment, regardless of actual performance, the status module 202 may determine that a predefined condition is satisfied based on the number of program/erase cycles an erase block or another set of storage cells has endured satisfying a predefined threshold.

In another embodiment, a predefined condition may include a program/erase cycle count threshold or another age threshold. The status module 202 may compare a program/ erase cycle count for a set of one or more storage cells (e.g., an erase block) with a program/erase cycle count threshold or other age threshold. In one example, where a single level NAND flash is rated at 100,000 program/erase cycles before anticipated failure, a storage controller 124 may define a program/erase cycle threshold at 5,000 program/erase cycle intervals, or the like. In this example, the status module 202 may count program/erase cycles for an erase block and indicate that a predefined condition is satisfied after 5,000 cycles. In this example, the status module 202 may again indicate a predefined condition is satisfied again after 10,000 total cycles, 15,000 total cycles, or the like. In one embodiment, the status module 202 may or may not consider the actual performance characteristics of the erase block or other set of storage cells. The status module 202 may use other values for a threshold depending on the physical characteristics or architecture of the storage cells. For example, a multi-level NAND flash may be rated at 5,000 cycles before anticipated failure. In this example, a predefined condition may include a program/erase count of 500 program/erase cycles, or the like.

In another embodiment, a predefined condition may include different types of use thresholds, different stages of use thresholds, or the like. In one example, the status module 202 may determine that an erase block or other set of storage cells satisfies a predefined condition at program/erase counts of 5,000, 8,000, and then every 2,000 cycles, so that the size of the interval between the predefined conditions decreases over time. Depending on the performance characteristics or the condition of the storage cells, the status module 202 may customize or define specialized intervals for different use and/or degradation thresholds of one or more predefined conditions.

In another example, the status module 202 may measure an up-time for a set of storage cells (e.g., a page, a word line, an erase block, the non-volatile memory media 122, the non-volatile memory device 120, or the like). As used herein, an "up-time" for one or more storage cells may include an amount of time that the storage cells and/or the non-volatile memory device 120 have been powered on or available for use. In certain embodiments, flash based storage devices may also degrade over time regardless of use. Over time, the performance of an erase block or other set of storage cells may decline even if the storage cells do not currently store data. In one embodiment, regardless of actual performance, the status module 202 may determine that a set of storage cells satisfies a predefined condition based on the time the storage cells are powered on or available for use.

In another embodiment, the status module 202 may compare an up-time for a set of storage cells with an up-time threshold or other use threshold. In one example, the status module 202 may indicate that a page, an erase block, or another set of storage cells be read every 30 days of use, regardless of actual or measured performance, or other degradation condition. In this example, the status module 202 may measure an up-time associated with a set of storage cells and may indicate that a predefined condition is satisfied after the set of storage cells has been in use for more than 30 days without a storage capacity recovery operation, garbage collection, or grooming. Another up-time threshold may be used depending on physical characteristics of the storage cells. A non-volatile memory media 122 with better endurance, in certain embodiments, may allow more up-time between reads by the read operation module 150 to maintain optimal performance.

While various predefined conditions are described herein, one or more predefined conditions selected for a specific type of non-volatile memory media 122 may not be appropriate or effective for other types of non-volatile memory media 122. For example, in certain embodiments, a predefined condition for a set of storage cells is selected that is associated with a decrease or loss in one or more stored read voltage levels for the set of storage cells, so that the read module 204 may perform one or more read operations, as described below, to increase the one or more stored read voltage levels. If a similar predefined condition, in another type of non-volatile memory media 122, tends to increase instead of decrease a stored read voltage level, such a predefined condition may not be appropriate. For example, while a program/erase cycle count is described as one embodiment of a predefined condition, for certain architectures, geometries, or types of non-volatile memory media 122, a stored read voltage level may increase over time and performing a read operation that also increases the stored read voltage level may exacerbate the situation, and a program/erase cycle count or other age-based threshold may not be appropriate.

In another embodiment, the status module 202 may monitor a bit error rate (BER) for an erase block on the non-volatile media 122. A BER for an erase block of the non-volatile memory device 102 may be expressed as a percentage of the number of decoded bits that are incorrect, divided by the total number of bits read from a page, an erase block, or another set of storage cells. In one embodiment, the bits may be correctable via an ECC checksum, or the like. In other embodiments, the errors may be uncorrectable. A bit error rate may include a raw bit error rate (RBER), an uncorrectable bit error rate (UBER), or the like As used herein, a RBER includes a rate of errors in bits read from storage cells before they are corrected. Although there may be bit errors in data read from a set of storage cells, the bits may be corrected by an ECC checksum, or the like. Bit errors may be caused by shifts in stored read voltage levels, read disturb effects, program disturb effects, noise, interference, distortion, or bit synchronization errors. Therefore, a raw bit error rate may or may not indicate a failing erase block. However, a consistently increasing number of raw bit errors from a specific erase block, may indicate a degraded condition of the erase block or the like. In one embodiment, the status module 202 may detect an increasing raw bit error rate for a set of storage cells, a raw bit error rate that exceeds a predefined threshold, or the like, and determine that a predefined condition is satisfied.

As used herein, an uncorrectable bit error rate (UBER) includes a rate of errors in bits read from storage cells that are uncorrectable using an error-correcting code (ECC) for the bits. Although uncorrectable using ECC alone, in certain embodiments, an uncorrectable bit error may be corrected by adjusting a read voltage threshold for the storage cells, by using parity data or a backup copy of data, or the like. Similar to raw bit error rates (RBERs), an uncorrectable bit error rate (UBER) may indicate a failing erase block, degradation of an erase block, of the like. In certain embodiments, the status module 202 may detect an increasing rate of uncorrectable bit errors, an uncorrectable bit error rate that exceeds a predefined threshold, or the like, and determine that a predefined condition is satisfied.

In another embodiment, the status module 202 may compare a bit error rate (e.g., RBER, UBER, or the like) to an error rate threshold or other use threshold as a predefined condition. For example, the status module 202 may use a predefined condition comprising a bit error rate of $10^{-9}$ for one or more storage cells (e.g., a page, a word line, an erase block, the non-volatile memory device 120). A bit error rate of $10^{-9}$ means that 1 bit out of every $10^9$ bits is incorrect and in error. In this example, the status module 202 may measure a bit error rate associated with a page, an erase block, or another set of storage cells, and if the current bit error rate is above the bit error rate threshold (e.g., has more than 1 bit in error out of every $10^9$ bits), the status module 202 may determine that the set of storage cells satisfies the predefined condition. This disclosure is not limited in this regard. Other bit error rates may be used depending on many factors, including, but not limited to, operating conditions, environment, technological advances, or the like.

In one embodiment, in response to the status module 202 determining that a predefined condition for the one or more storage cells is satisfied, the read module 204 may condition, prepare, prime, or the like, the one or more storage cells for use. As used herein, conditioning, preparing, and/or priming one or more storage cells for use may comprise adjusting a characteristic or parameter of the one or more storage cells to make the one or more storage cells more ready for use. In one embodiment, conditioning, preparing, and/or priming a set of storage cells may comprise changing, modifying, or otherwise adjusting the stored read voltage levels of the one or more storage cells (e.g., to be within a predetermined or serviceable voltage threshold, to be within a read voltage threshold for an abode, or the like).

If a set of one or more storage cells satisfies a predefined condition, for example, the status module 202 may determine that the set of storage cells may not be in a useable, reliable, or otherwise serviceable state. As described below, in response to the status module 202 determining that a set of storage cells satisfies a predefined condition, such as the non-volatile memory device 120 being unpowered for at least a predefined amount of time, the read module 204 may condition, prepare, and/or prime the set of storage cells, by performing one or more read operations or the like, thereby adjusting the stored read voltage levels of the set of storage cells due to a read disturb effect.

For example, due to a predefined condition such as the non-volatile memory device 120 being powered down/off, powered up/on, having been powered down/off or unpowered for a predetermined amount of time, or the like, the stored read voltage levels of one or more non-volatile storage cells may have drifted below or beyond a predetermined read voltage threshold, causing one or more bit errors. The read module 204, in certain embodiments, may counteract certain of the negative side-effects of a predefined condition and correct, adjust, modify, or the like, the stored read voltage levels of the one or more storage cells in order to condition, prepare, prime, or the like the one or more storage cells for use (e.g., to service read requests, write requests, or the like). For example, the status module 202, in one embodiment, may cause the read module 204 to perform a conditioning scan, a preparatory scan, a priming scan, or the like of the non-volatile memory media 122, performing one or more read operations on each erase block of the non-volatile memory media 122; on one or more predefined word lines or pages of each erase block; on each word line or page of each erase block of the non-volatile memory media 122; on one or more word lines, pages, and/or erase blocks that satisfy a predefined condition; or the like in response to the non-volatile memory device 120 being powered up/on, after a predefined period of being powered down/off or otherwise unpowered, or in response to another predefined condition, before data is read from the non-volatile memory device 120 to satisfy read requests from storage clients 116.

In one embodiment, in order to condition, prepare, and/or prime one more storage cells or the like, the read module 204 may be configured to perform one or more read operations for a set of one or more non-volatile storage cells in response to the status module 202 determining that a predefined condition for the one or more storage cells is satisfied. As described above, read operations of the read module 204 may be intended to affect one or more stored read voltage levels of the associated storage cells, of physically adjacent storage cells, or the like and the data read by the operation may be irrelevant. In certain embodiments, read operations of the read module 204 may comprise "dummy" read operations, "pseudo" read operations, "spoof" read operations, or the like and read result module 206 described below may discard or ignore the read data.

The read module 204 may perform one or more read operations to intentionally create read disturb effects in one or more storage cells of the non-volatile memory media 122. In certain embodiments, as described below with regard to the target module 302, the read module 204 may target one or more stored read voltage levels of specific storage cells for adjustment using read operations, by performing read operations on adjacent, neighboring pages or the like. In a further embodiment, the read module 204 may perform read operations for each word line of an erase block, each page of an erase block, each page of the non-volatile memory device 120, or the like, without targeting just a subset of the storage cells. A granularity or scope of the storage cells for which the read module 204 performs read operations may correspond to a granularity or scope of storage cells that the status module 202 monitors.

In certain embodiments, the read module 204 may perform one or more read operations on a set of storage cells in response to the status module 202 determining that the computing device 110 and/or the non-volatile memory device 120 have been powered on after being powered down, determining that the non-volatile memory device 120 has been powered down or unpowered for a predetermined amount of time, detecting that an erase block was only partially programmed with data prior to shutting down, or that the set of storage cells satisfies another predefined condition.

As described above, the computing device 110, the non-volatile memory device 120, or the like may be powered off before the media controller 126 has programmed each of the pages of an erase block of the non-volatile memory media 122. In certain embodiments, the read operation module 150 may track erase blocks that are being programmed. In one embodiment, the read operation module 150 may track erase blocks that are being programmed by storing an indicator in the metadata 135 for an erase block. In response to the computing device 110 powering on, the status module 202 may determine that an erase block had been only partially programmed with data by reading the indicator in the metadata 135. In another embodiment, the status module 202 may determine that an erase block had been only partially programmed by scanning data of the erase block in response to the computing device 110 powering on or the like. In response to the status module 202 determining that the erase block was only partially programmed, based on the indicator, based on an erase block scan, or the like, the read module 204 may perform one or more read operations on at least a portion of storage cells in the non-volatile memory media 122 that had not been programmed prior to the shutdown, such as an adjacent or neighboring page to a last programmed page or the like.

In one embodiment, reading from non-volatile storage cells may raise or increase a stored read voltage level for the storage cells, due to a read disturb effect. In a further embodiment, reading from non-volatile storage cells may raise a stored read voltage level for one or more adjacent or neighboring storage cells, due to a read disturb effect. The specific storage cells affected by a read operation, may be determined based on a page architecture for the non-volatile memory device 120, an addressing scheme for the non-volatile memory device 120, a physical storage cell geometry or layout for the non-volatile memory device 120, or the like.

Increasing a stored read voltage level for a set of one or more storage cells, in certain embodiments, may decrease an error rate for the storage cells, correct one or more bit errors, or the like. For example, after being unpowered or powered down for a period of time, or satisfying another predefined condition, stored read voltage levels for a set of storage cells may have decreased, leaked, shifted, or the like, and increasing or otherwise adjusting the stored read voltage levels using one or more read operations may correct the decrease, at least partially, returning at least a portion of the stored read voltage levels to their originally programmed abodes. Correcting stored read voltage levels for a set of storage cells may increase performance of the non-volatile memory media 122 because the media controller 126 may read more accurately which may result in fewer bit errors, fewer read retries, or the like.

In another embodiment, the read module 204 may perform multiple read operations (e.g., a predefined number of read operations) on a set of storage cells. For example, the read module 204 may perform five read operations on each page of an erase block, each page of a non-volatile memory device 120, or the like, in response to the non-volatile memory device 120 being powered on after being powered off or satisfying another predefined condition as described above. The predefined number of read operations that the read module 204 may be based on an amount of charge that each read disturb from a read operation causes, based on an amount of drift or shift in a stored read voltage level, based on an error rate (e.g., RBER, UBER), based on a P/E count or other indicator of age, based on a usage history for the non-volatile memory device, or the like. For example, a single read operation may not cause enough of a read disturb effect to correct a drift or shift in a stored read voltage level but a predefined number of multiple read operations may provide a large enough combined read disturb effect to correct errors, programming or adding enough charge to place the stored read voltage levels back within the intended, correct abodes.

In one embodiment, the read module 204 operates as a background task. In another embodiment, while the media controller 126 is storing or programming data in one or more erase blocks of the non-volatile memory media 122, the read module 204 may concurrently perform read operations on one or more other erase blocks of the non-volatile memory media 122. In another embodiment, the read module 204 may temporarily stop or pause performing read operations in response to a read or write request for data in a page or erase block for which the read module 204 is performing a read operation.

In one embodiment, the read module 204 may start or initiate a read operation with a read command (e.g., a READ PAGE command, a READ PAGE CACHE SEQUENTIAL command, or the like) and may provide an address or other identifier for the read command, depending on the type of read command, causing the non-volatile memory media 122 to load data associated with the read command from the non-volatile memory media 122 to a data register or other volatile memory buffer (e.g., a read buffer) of the non-volatile memory media 122, during a T-read time or the like.

For example, for NAND flash non-volatile memory media 122, logic for the non-volatile memory media 122 may execute a read command by applying a read voltage (e.g., V-read) to the control gates of selected storage cells (e.g., a selected word line, a selected page, or the like for a read command) of the associated erase block. The logic may apply a pass voltage or inhibit voltage (e.g., V-pass) to the control gates of the one or more un-selected storage cells (e.g., un-selected word lines, un-selected pages, or the like) of the read command, which may cause the un-selected storage cells to serve as transfer gates or pass gates so they have little or no effect on currents from the selected storage cells.

One or more sense amplifiers, or other logic, may sense or determine the data stored by the one or more selected storage cells based on a presence of, and/or an amount of, channel current for each selected storage cell, which is influenced by the amount of charge present in the floating gate of the selected storage cell. In some embodiments, such as for certain NAND flash memory media, the pass voltage or inhibit voltage, V-pass, applied to un-selected storage cells may comprise an elevated voltage that is higher than the read voltage, V-read, applied to selected storage cells in order to ensure that no current is induced in the un-selected storage cells. The elevated level of V-pass may cause a read disturb effect on the un-selected storage cells. In such an embodiment, by applying a V-read voltage to selected storage cells and a V-pass voltage to un-selected storage cells, the sense amplifiers may detect a current from certain of the selected storage cells (e.g., storage cells with a stored read voltage level greater than V-read) while the un-selected storage cells may not be detected by the sense amplifiers regardless of their stored read voltage level. For MLC or TLC NAND flash, or the like, this process may be repeated for multiple read voltage thresholds, depending on the page of the selected storage cells being read (e.g., lower page, middle page, upper page).

In certain embodiments, it may be the pass voltage or inhibit voltage (e.g., V-pass) applied to the control gates of the one or more targeted storage cells (e.g., un-selected word lines, pages, or the like) that causes a read disturb effect in the targeted storage cells, which may be adjacent to or neighboring the storage cells, word line, and/or page to which the read command was directed (e.g., one or more adjacent or neighboring storage cells, neighboring word lines, neighboring pages, or the like). The read module 204, in one embodiment, may determine or set a custom pass voltage or inhibit voltage (e.g., V-pass) in order to control and/or maximize a read disturb effect caused by a read operation. In one embodiment, at least a portion of the read operation module 150, the read module 204, or the like may be integrated with a non-volatile memory element 123 by a manufacturer or the like, and may apply a pass voltage or inhibit voltage (e.g., V-pass) or another specifically designed disturb voltage to selected storage cells, to each storage cell, or the like to intentionally cause a read disturb effect without necessarily applying the read voltage (e.g., V-read), since the stored data values may not be relevant to the read disturb effects. In other embodiments, the read module 204 may execute or request a standard read operation using a standard read command, causing both a read voltage (e.g., V-read) to be applied to selected storage cells and a pass voltage or inhibit voltage (e.g., V-pass) to be applied to un-selected storage cells.

In certain embodiments, after a T-read time or other predefined amount of time has elapsed, the data is present in the data register or read memory buffer and is ready to be streamed or retrieved from one or more non-volatile memory elements 123 by the non-volatile memory media controller 126, for example, by asserting a read enable signal (e.g., RE#), transitioning a read enable signal for each byte of data, or the like and causing the data to be output onto one or more I/O lines (e.g., the I/O bus 127) from the non-volatile memory elements 123 (e.g., 16 lines, 32 lines, 64 lines).

Instead of reading, retrieving, streaming, or otherwise transferring the data of the read command from the data register or memory buffer (e.g., read buffer), in one embodiment, the read result module 206 may be configured to discard, ignore, or disregard the data from one or more read operations of the read module 204, to interrupt the read command, or the like. For example, the read result module 206 may fail to assert a read enable signal (e.g., RE#), transition a read enable signal, or the like, so that the data of a read operation or read command is not output from the non-volatile memory element 123 or may otherwise prevent data from a read operation of the read module 206 from being sent or delivered to a storage client 116, such that the data does not leave the non-volatile memory device 120, does not leave the non-volatile memory media 122 or an associated read buffer, does not leave a non-volatile memory element 123, the read operation is interrupted, or the like.

Because the read operations of the read module 204 may provide a read disturb effect to adjust a stored read voltage level regardless of the data stored by the storage cells, as described above, the read result module 206 may safely ignore, discard, disregard, or overwrite the resulting data without processing the data with an ECC decoder, without providing the data to the host computing device 110, without providing the data over a bus 125, without providing the data to a storage client 116, without streaming the data from non-volatile memory media 122 or an associated volatile read buffer, or the like, thereby interrupting the read operations.

As used herein, discarding or disregarding data from a read operation may include ignoring the data, interrupting transmission of the data, deleting the data from or overwriting the data in a volatile memory buffer (e.g., a read buffer), bypassing an ECC decoder for the data, failing to send the data to a storage client 116 or a host computing device 110, failing to stream the data from a volatile memory buffer (e.g., a read buffer), failing to assert or send a read enable signal (e.g., RE#), sending a RESET command to a non-volatile memory element 123 during a read operation, performing a subsequent read operation without streaming the data from a volatile memory buffer (e.g., a read buffer), or the like. The read result module 206 may discard or disregard data resulting from a read operation of the read module 204 in one or more of these ways, which may increase the efficiency of the read operations when compared to a standard read operation where data is decoded and returned to a storage client 116.

In certain embodiments, by interrupting a read operation (e.g., sending a RESET command), failing to issue a stream command (e.g., failing to assert a read enable signal) to transfer data from a volatile memory buffer (e.g., a read buffer), allowing data to be overwritten in a volatile memory buffer (e.g., a read buffer), or the like, the read result module 206 may ensure that the data of a read operation does not leave the non-volatile memory media 122 in conjunction with the read operation (e.g., remains within a die, chip, or other non-volatile memory element 123 of the non-volatile memory media 122). In this manner, the read result module 206 may bypass an ECC decoder for the data or other processing or decoding that would otherwise occur for a read operation, such as a hardware ECC decoder of the non-volatile memory media controller 126, a software ECC decoder of the SML 130, or the like.

In one embodiment, the read result module 206 may receive data from the non-volatile media 122 and discard the data. For example, the read module 204 may perform one or more read operations on the non-volatile memory media 122 and the read data may be copied to an internal memory buffer or register (e.g., a read buffer). The read result module 206 may delete the read data in the buffer, may allow the data to be overwritten within the buffer, or the like before the data is transferred to the media controller 126, to the SML 130, or the like.

In another embodiment, in response to one or more read operations by the read module 204, the read result module 206 may interrupt or prevent the transmission of data from the non-volatile memory media 122 by sending a RESET command to the associated one or more non-volatile memory elements 123 before the read data is transmitted. In a further embodiment, the read result module 206 may ignore the read data (e.g., without asserting a read enable signal) so that the read data is simply not transmitted to the media controller 126, to the SML 130, or the like, the read data being eventually overwritten by a subsequent read request.

Figure 3:
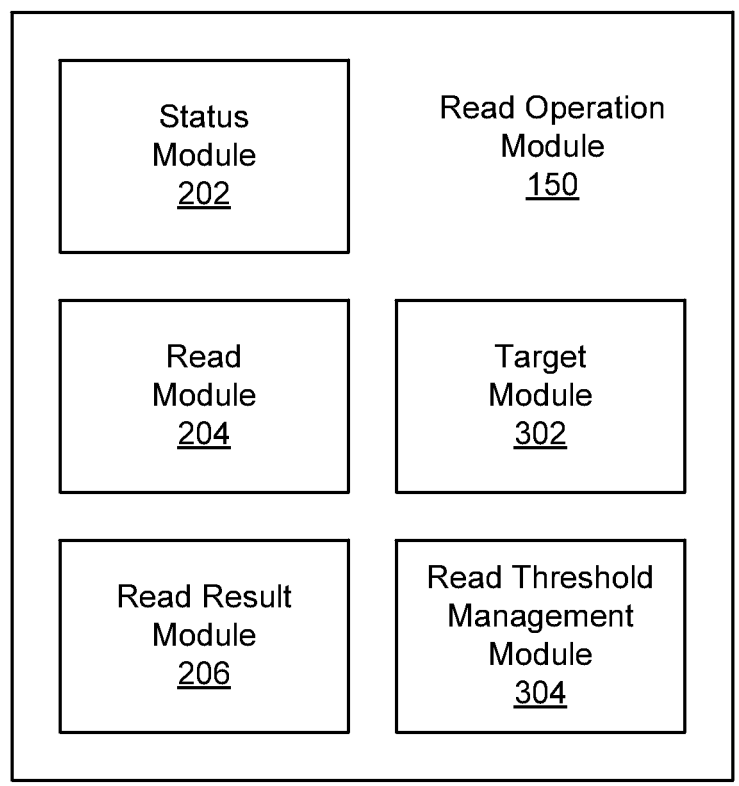
FIG. 3 is a schematic block diagram illustrating another embodiment of a read operation module.

FIG. 3 is a schematic block diagram illustrating another embodiment of the read operation module 150. In one embodiment, the read operation module 150 may include the status module 202, the read module 204, the read result module 206, a target module 302, and a read threshold management module 304. The status module 202, the read module 204 and the read result module 206 may or may not be substantially similar to modules depicted in FIG. 2.

In certain embodiments, the target module 302 may be configured to select at least one page, word line, or other set of storage cells of the memory media 122 for which the read module 204 will perform one or more read operations. In another embodiment, the selected pages may be based on one or more of a page architecture for the non-volatile recording device, an addressing scheme for the non-volatile recording device, and a physical cell geometry for the non-volatile recording device, to target certain storage cells likely to have lost charge causing a shift or drift in a stored read voltage level. In other embodiments, as described above, the read module 204 may perform one or more read operations for each page, each word line, or the like of the non-volatile memory device 120 to provide a read disturb effect to the entire non-volatile memory device 120 without targeting only specific storage cells.

As described above, regarding read disturb effects on storage cells on a non-volatile memory media 122, reading various cells on a memory media 122 may affect neighboring or adjacent storage cells, depending on how the storage cells are arranged and located in the non-volatile memory media 122, or other factors described herein. The target module 302 may be configured to select pages or word lines of the non-volatile recording media 122 based on the effects described and the physical organization or arrangement of the storage cells of the memory media 122 (e.g., may select storage cells with a spatial and/or electrical relationship relative to one or more target storage cells such that a read operation for the selected storage cells causes a read disturb effect in the target storage cells).

In certain embodiments, the target module 302 may target odd pages, even pages, lower pages, middle pages, upper pages, or the like of the non-volatile memory media 122. For example, a read operation for a lower page of a set of storage cells may be faster than a read operation for a middle page or an upper page of the storage cells, but may cause the same read disturb effects. In another embodiment, the target module 302 may target pages one page away, two pages away, or another predefined number of pages away from a targeted page, word line, or other set of storage cells, in order to cause a read disturb effect in the targeted storage cells.

As described above with regard to V-pass, in certain embodiment, a read operation may have the greatest read disturb effects on un-selected word lines of an erase block. In certain embodiments, the target module 302 may target a reliable word line or page of an erase block (e.g., a first word line, WL0, a first page, or another most reliable word line or page based on an architecture of the associated non-volatile memory element 123) for one or more read operations, so that read disturb effects are caused in the remaining word lines (e.g., un-selected word lines) or pages of the erase block.

As described above, in certain embodiments, the read module 204 may perform one or more read operations to cause a read disturb effect in a last or most recently programmed page or the like of a partially filled erase block that was not completely programmed with data prior to a shutdown or power down. In one embodiment, the target module 302 may be configured to select one or more storage cells (e.g., a page, a word line) on which the read module 204 may perform one or more read operations to cause a read disturb effect in a last programmed page of an erase block (e.g., the last page programmed prior to a shutdown or power down). For example, the target module 302 may select a page or word line from a set of storage cells adjacent to or neighboring a set of storage cells that were last programmed prior to a shutdown or power down of the non-volatile memory device 120, the host computing device 110, or the like (e.g., the last page plus one or the like).

As described above, the host computing device 110, the non-volatile memory device 120, or the like may be powered off before the media controller 126 has programmed each of the pages of an erase block of the non-volatile memory media 122. In certain embodiments, the target module 302 may track erase blocks that are being programmed. In one embodiment, the target module 302 may track erase blocks that are being programmed by storing an indicator in the metadata 135 for an erase block. In response to the host computing device 110 powering on, the target module 302, in cooperation with the status module 202 or the like, may determine that an erase block had been only partially programmed with data and/or a last programmed page by reading the indicator in the metadata 135.

In another embodiment, the target module 302, in cooperation with the status module 202 or the like, may determine that an erase block had been only partially programmed and/or a last programmed page by scanning data of the erase block in response to the computing device 110 powering on or the like. In response to the status module 202 determining that the erase block was only partially programmed, the target module 302 determining one or more pages, word lines, or other sets of storage cells for one or more read operations, based on the indicator, based on an erase block scan, or the like, the read module 204 may perform one or more read operations on the determined storage cells of the non-volatile memory media 122.

In one embodiment, the read operation module 150 may also include the read threshold management module 304. As a NAND flash non-volatile memory device 120 ages (e.g., experiences program/erase cycles), or experiences other harmful environmental affects as described herein, the read threshold management module 304, in certain embodiments, may compensate for changes in stored read voltage levels in storage cells of the non-volatile memory media 122 by dynamically adjusting and managing read voltage threshold levels over time. The read threshold management 304 may adjust a read voltage threshold for a set of storage cells based on an age or usage level, an error rate, or the like of the non-volatile memory device 120 and/or a set of storage cells (e.g., a program/erase count, a RBER, an UBER, or the like). In one embodiment, the read threshold management module 304 may determine a adjustment for a read voltage threshold based on a media characteristics of the non-volatile memory media 122, or the like.

A media characteristic is a statistic, heuristic, mathematical model, transform, or other descriptor associated with an attribute of the non-volatile memory media 122. A media characteristic for a set of storage cells may be substantially static or may be dynamic and change over time.

A media characteristic, in one embodiment, includes or relates to a make, a model, a manufacturer, a product version, or the like for the non-volatile memory device 120 and/or for the non-volatile memory media 122. In another embodiment, a media characteristic describes an attribute or statistic for a set of particular storage cells, such as a program/erase cycle count for the set of storage cells, a read count for the set of storage cells, a retention time since a previous write for the set of storage cells, a dwell time for the set of storage cells such as a logical or physical erase block (e.g., a time between a program of an erase block and an erase of the erase block), an average of multiple previous dwell times for the set of storage cells, an error statistic for the set of storage cells, or the like. A media characteristic, in a further embodiment, may include or relate to an environmental condition or a use of the non-volatile memory device 120 and/or of the non-volatile memory media 122, such as a temperature, a use case (e.g., a cache use case, an archival use case, a server use case, an enterprise use case, a consumer use case), or the like.

A media characteristic for a set of storage cells affects or informs the determination of an erase parameter for the set of storage cells. In one embodiment, the media characteristics include a program/erase cycle count for a set of storage cells. In another embodiment, the media characteristics include a read count for a set of storage cells. The media characteristics, in a further embodiment, include a retention time since a previous write for a set of storage cells. In an additional embodiment, the media characteristics include a temperature for a set of storage cells. The media characteristics, in certain embodiments, include a use case for a set of storage cells. In another embodiment, the media characteristics include an error statistic for a set of storage cells, such as an UBER, a RBER, or the like. In a further embodiment, the media characteristic may include previous or historical erase parameters for a set of storage cells, erase parameters or media characteristics for other sets of storage cells, or the like.

The read threshold management module 304 may adjust various parameters for read operations, program operations, or the like. The adjustments may be based on detected characteristics previously described, use thresholds, degradation thresholds, or the like, or another condition determined by the status module 202. In one embodiment, the read module 204 may perform one or more read operations on the non-volatile memory media 122 based on the read voltage threshold adjustments by the read threshold management module 304.

Figure 4A:
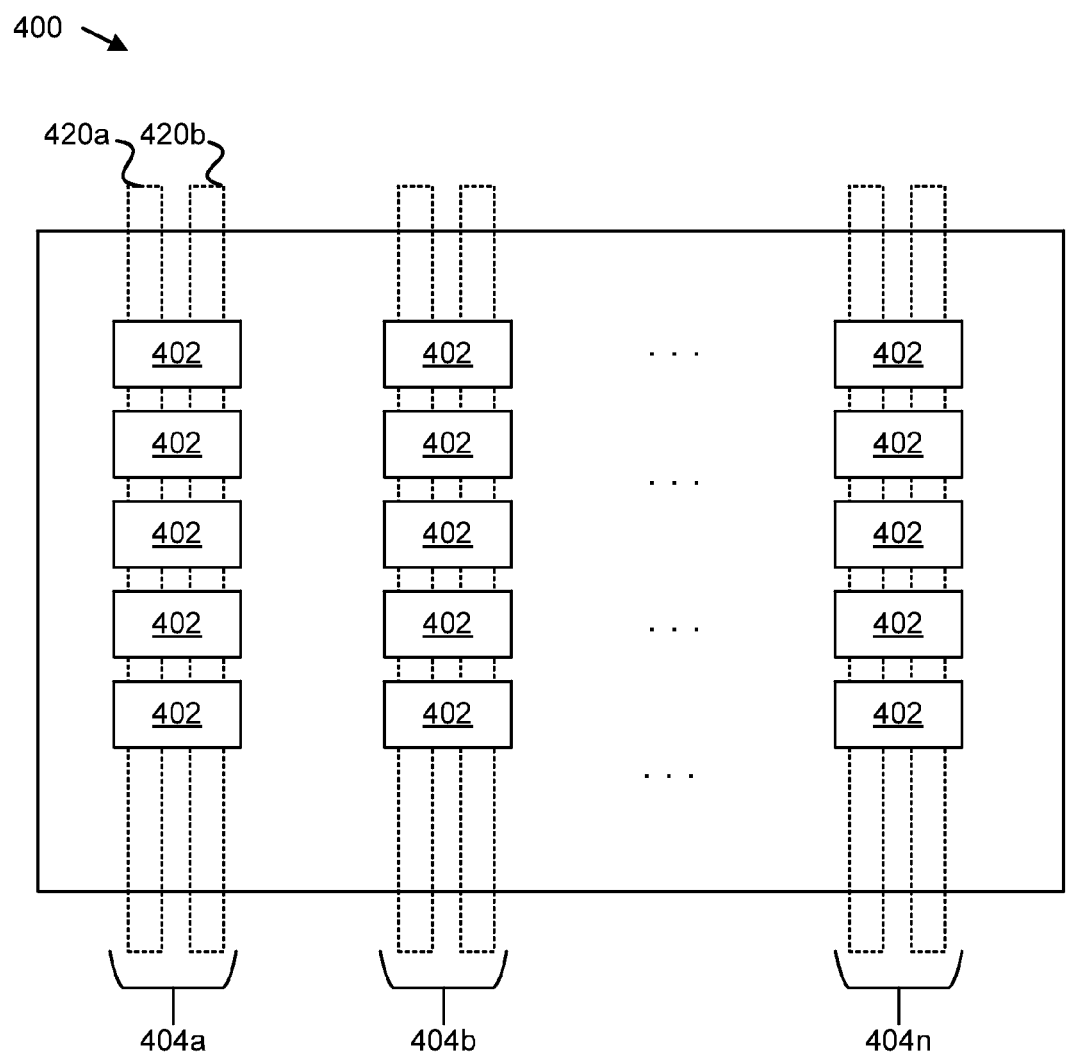
FIG. 4A is a diagram illustrating one embodiment of non-volatile storage cells for a non-volatile memory device.

FIG. 4A is a diagram illustrating one embodiment of an erase block 400 of non-volatile storage cells 402 for a non-volatile memory device 120. Non-volatile storage cells 402 of a non-volatile memory media 122 may be arranged in a wide variety of different layouts, formats, architectures, geometries, or the like. In the depicted embodiment, the non-volatile storage cells 402 are arranged in columns 404a-404n or word lines 404a-404n, each column 404a-404n forming one or more pages 420 (e.g., one page for SLC storage cells, two pages for MLC storage cells, three pages for TLC storage cells). Although FIG. 4A depicts three columns 404a-404n this disclosure is not limited in this regard as a non-volatile memory media 122 may include many more columns of non-volatile storage cells 402. A media controller 126 may identify a first column as a column 'a', a second column as a column and additional columns up to column 'n'. Therefore, the letter 'n' may depict the n-th column, where 'n' represents any number greater than two.

A multi-level (e.g., MLC, TLC) storage cell 402 may encode multiple bits associated with multiple pages 420, such as a lower page, a middle page, and/or an upper page, or the like. In the depicted embodiment, each depicted column 404a-404n of storage cells 402 stores data of a first page 420a and a second page 420b. In accordance with the architecture depicted in FIG. 4A, a media controller 126 may program a lower page 420a and an upper page 420b of a first column 404a-n or word line 404a-404n of storage cells 402. However, before the media controller 126 programs each page 420 (e.g., pages 420 of one or more later 'n' columns or word lines), a user may power down the host computing device 110 and/or the non-volatile memory device 120. As previously described, programming a set of storage cells 402 (e.g., a word line 404, column 404, or page 420) may affect stored read voltage levels for an adjacent or neighboring set of storage cells 402 (e.g., a word line 404, column 404, or page 420). This effect may be known as a program disturb.

Furthermore, an expected program disturb effect of programming each page 420 of an erase block 400 may not occur if each page 420 is not programmed before a shutdown or power down. In certain embodiments, both a lower page 420a and an upper page 420b of a set of storage cells 402 must be programmed prior to a shutdown or power down in order for data to be correctly read from either page 420a, 420b. Therefore, in one example, the target module 302 may determine that the last programmed page 420 prior to a shutdown or power down was the upper page 420b of the first column 404a of the erase block 400. The target module 302 may select the lower page 420a of an adjacent set of storage cells 402 of an adjacent column 404b, for which the read module 204 is to perform one or more read operations in response to the host computing device 110 being powered on, to cause a read disturb effect in the storage cells 402 of the first column 404a or word line 404a in place of the expected program disturb effects that never occurred as the adjacent column 404b or word line 404b was never programmed.

Figure 4B:
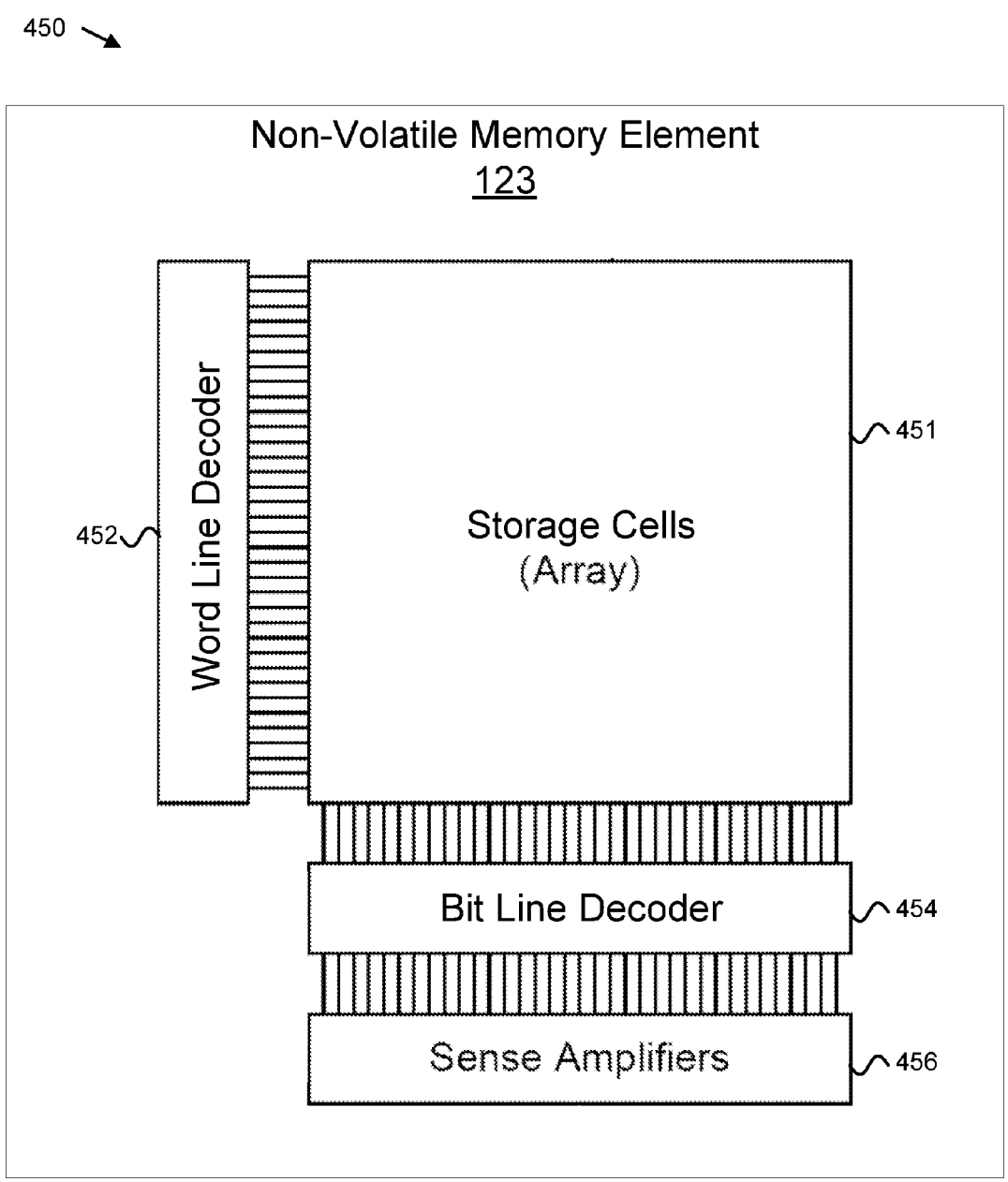
FIG. 4B is a diagram illustrating one embodiment of a non-volatile memory array for a non-volatile memory device.

FIG. 4B depicts one embodiment of a non-volatile memory element 123 that includes an array 451 of storage cells, a word line decoder 452, a bit line decoder 454, and sense amplifiers 456. In one embodiment, a non-volatile memory media controller 126 controls the application of different voltage levels at the word line decoder 452 and/or the bit line decoder 454 to perform memory access operations, such as read, write/program, erase, or other operations, at some or all of the storage cells. Although the non-volatile memory element 123 is shown with only a single array 451 of storage cells, other embodiments may include multiple arrays 451 of storage cells (e.g., erase blocks, die, die planes, chips, packages, or other integrated circuits), in which case each array 451 may have its own word line decoder 452 and bit line decoder 454, but may share the same non-volatile memory media controller 126 or the like.

In one embodiment, when writing data to the storage cells, digital signals are transferred via an I/O bus to an I/O buffer and then to the sense amplifiers 456. The sense amplifiers 456, in some embodiments, convert the digital values to corresponding analog signals and modify the signals as needed. The non-volatile memory media controller 126 uses the addresses provided in the write command to write to bit line values for a given word line within the array 451 of storage cells. In particular, the non-volatile memory media controller 126 controls the word line decoder 452 to activate a particular word line and, simultaneously, controls the bit line decoder 454 to transfer values from the sense amplifiers 456 to the selected word line(s) and bit line(s).

In order to retrieve stored data from the memory elements 123, the non-volatile memory media controller 126 uses one or more addresses of a read command to read out word bit values for a given word line within the array 451 of storage cells. In particular, the non-volatile memory media controller 126 may control the word line decoder 452 to activate a particular word line of storage cells and, simultaneously, controls the bit line decoder 454 to transfer bit line values from the selected word line of memory elements 123 to corresponding sense amplifiers 456. In the present embodiment, the sense amplifiers 146 convert the stored analog signals to corresponding digital values (e.g., detect currents induced by a V-read voltage as described above) and transfer the digital signals to an I/O buffer.

In one embodiment, the non-volatile memory element 123 comprises a NAND flash memory element 123 with NAND flash storage cells. In such an embodiment, logic of the non-volatile memory element 123 may execute a read command by causing or commanding the word line decoder 452 to apply a read voltage, V-read, to the control gates of storage cells of a selected word line. The logic may also cause the word line decoder to apply a pass voltage or an inhibit voltage, V-pass, to the control gates of one or more un-selected word lines of the array 451, based on the read command, which may cause the un-selected storage cells to serve as transfer gates (e.g., passive transistors). As described above, the pass voltage or inhibit voltage, V-pass, may cause a read disturb effect in the un-selected storage cells of the array 451.

One or more sense amplifiers 456, or other logic, may sense or determine the data stored by a selected word line of the array 451 based on a presence of, and/or an amount of, channel current for the selected word line. In one embodiment, the channel current is influenced by the amount of charge present in the floating gate of the selected word line. In some embodiments, as described above, the pass voltage or inhibit voltage, V-pass, applied to un-selected word lines via the word line decoder 452 may comprise an elevated voltage threshold that is higher than the read voltage, V-read, applied to selected word line, and which may cause a read disturb on the un-selected word lines.

For example, the word line decoder 452 may apply aa read voltage, V-read, to a selected word line of the array 451 (e.g., the first word line or another targeted word line) such as WL0, and may apply a pass voltage or inhibit voltage, V-pass, to the other word lines of the array 451 (e.g., the un-selected word lines), such as WL1-WLn. In this example, by applying a read voltage, V-read, to word line WL0, and a pass voltage or inhibit voltage, V-pass, to word lines WL1-WLn, the charges from bits in word line WL0 may be detected by the sense amplifiers 456 and the charge from word lines WL1-WLn may not be detected or have an effect on the sense amplifiers 456. Moreover, in such an example, by applying a V-read voltage to word line WL0 and a V-pass voltage to word lines WL1-WLn, a read disturb effect is generated on word lines WL1-WLn by the application of a V-read on word line WL0. For MLC or TLC NAND flash, or the like, this process may be repeated for multiple read voltage thresholds and associated V-read levels, depending on the page of the selected storage cells being read.

Figure 5:
FIG. 5 is a diagram illustrating one embodiment depicting only a subset of non-volatile storage cells being programmed before a shutdown.
Figure 5:

FIG. 5 is a diagram illustrating one embodiment of an erase block 500 with only a subset of non-volatile storage cells being programmed before a shutdown or power down. In one embodiment, a media controller 126 may program one or more first pages of an erase block 500, but the host computing device 110 and/or the non-volatile memory device 120 may be powered down before one or more later pages of the erase block 500 are programmed. In the depicted embodiment, the media controller 126 has programmed the erase block 500 with data up to a stopping point 510, after which the word lines or pages of storage cells are all in an erased state (e.g., the depicted binary ones). The status module 202 and/or the target module 302, in certain embodiments, may scan the erase block 500 to determine that the erase block 500 was only partially programmed with data prior to being shutdown or powered down, to locate the stopping point 510, or the like. In a further embodiment, the status module 202 may maintain metadata for the erase block 500, indicating the stopping point 510 (e.g., a last programmed page or word line). The target module 302, as described above, may select a page, word line, or other set of storage cells adjacent to the stopping point 510 and the read module 204 may perform one or more read operations on the selected storage cells after recovery from being powered down (e.g., being powered on).

Figure 6A:
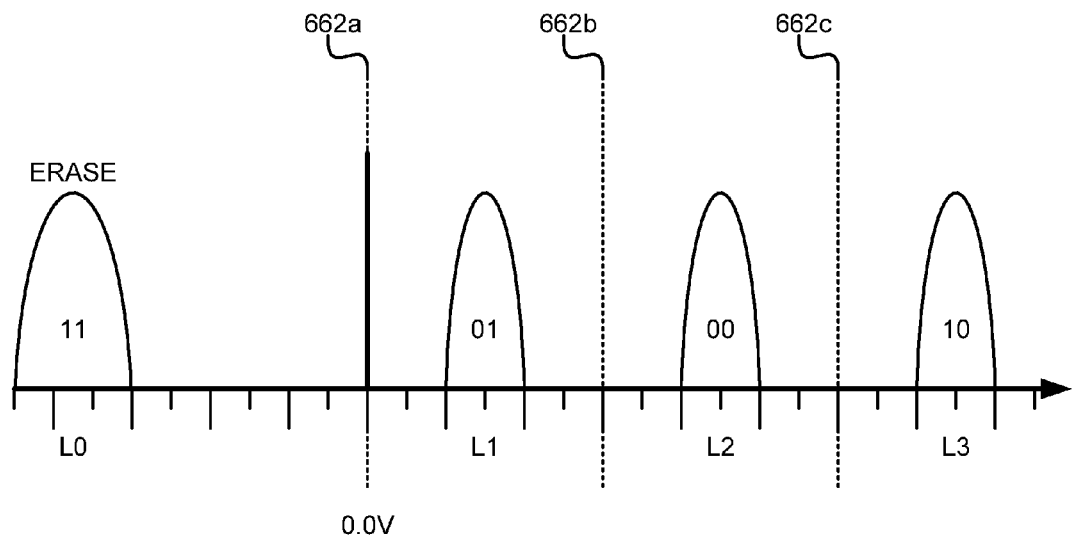
FIG. 6A is a diagram illustrating one embodiment of a set of multilevel storage cells of a non-volatile memory device.

FIG. 6A is a diagram illustrating one embodiment of a set of multilevel storage cells of the non-volatile memory device 120. The illustration depicts a set of multi-level storage cells, such as MLC NAND flash storage cells, or the like, with an example encoding or programming model. Any limitations inherent in the represented encoding model do not necessarily apply to all other encoding models, and the present disclosure should not be construed as inherently containing any such limitations. The read voltage states or abodes, in the depicted embodiment, are encoded using a Gray code encoding model, with binary values for adjacent states differing by a single bit in the encoding.

FIG. 6A shows that the value "11" is associated with the lowest read voltage state or abode (labeled L0, an "erase" state), the value "01" is associated with the next lowest read voltage state or abode (labeled L1), the value "00" is associated with the next highest read voltage state or abode (labeled L2), and the value "10" is associated with the highest read voltage state or abode (labeled L3). In FIG. 6A, the lowest read voltage state L0 is depicted as a negative voltage. Values, magnitudes, sizes, and the like of read voltages may vary by manufacturer and type of non-volatile memory cell, each of which are encompassed by the present disclosure. The configuration parameters 662, in the depicted embodiment, are read voltage thresholds 662 that separate states L0, L1, L2, and L3.

The non-volatile memory media controller 1264 interprets the four discrete levels of voltage stored in the multi-level storage cell as representing two binary bits one represented by a most significant bit (MSB) in the cell encoding and one represented by a least significant bit (LSB) in the cell encoding. As explained above, other programming and encoding models may be used. Also, certain non-volatile memory media 122 may have more than four possible states, allowing more than two binary values to be stored in a single multi-level storage cell. The voltage levels L0, L1, L2, and L3 may or may not be contiguous; for example, in certain embodiments, the voltage levels are separated by band gaps known as guard band. For example, L0 and L1 may be separated by 0.3V.

In one embodiment, the LSB corresponds to a lower page of data and the MSB corresponds to an upper page of data. In certain embodiments, the multi-level storage cell may adhere to a two-phase programming model, described below, which requires that the LSB be written to before the MSB can be written or vice versa. In another embodiment, the LSB and MSB may be programmed separately by the non-volatile memory media controller 126. Such an approach may be taken due to vendor or manufacturer requirements for page pairing (e.g., a LSB bit of MLC cell is paired with an MSB bit of a different MLC cell) and page addressing (e.g., LSB page must be programmed before the MSB page or vice versa). In certain instances, the LSB must be written before the MSB is written, the MSB must be written before the LSB is written, or the like.

In certain embodiments, the non-volatile memory media 122 may employ a two-phase programming model. In such a model, a binary value is first written to the LSB by way of a first write command to the lower page. The write command causes the multi-level storage cell to move from its initial state (for example, a "11" state in L0) to an intermediate state (the lower-to-middle LM state—between L1 and L2) configured such that a '00' state is subsequently read. For example, writing a "0" to the lower page causes the multi-level storage cell to change from the L0 state (where both the LSB and the MSB are 1) to the L2 state (where the LSB is changed to a 0). A subsequent write of a "0" to the upper page moves the multi-level storage cell from the intermediate state (typically between the L1 state and the L2 state) to L2 state such that both bits of the MLC are "0".

Thus, in such an embodiment, two writes (one to the lower page and one to the upper page) are needed to move the multi-level cell from L0 to L2, since the cell transitions through the intermediate state and the MLC device requires that the lower page be programmed before the upper page and does not allow partial programming of a page without an intervening erase operation. Writing a "1" to either of the upper page or lower page will cause the MLC to transition to either L1 or L3 depending on the binary value of the lower page at the time. In addition, certain non-volatile memory media vendors may impose a requirement that the lower page must be written to before the upper page, or the like. In other embodiments, the non-volatile memory media 122 may employ a two-phase programming model where a binary value is first written to the MSB by way of a first write command to the upper page.

In certain embodiments, the read threshold management module 304 determines and manages read voltage thresholds 662 or other configuration parameters individually for one or more of the abodes L0, L1, L2, L3, determining different settings or adjustments to configuration parameters in different abodes L0, L1, L2, L3. In one embodiment, the read threshold management module 304 adjusts one or more read voltage thresholds 662 based on a subset of binary data that multi-level storage cells store, such as just an upper page, just a lower page, or the like. In such embodiments, examining the state changes for the LSB bit(s) indicate the direction the voltage in the multi-level storage cell is changing. For both Gray code encoding (as depicted in FIG. 6A) and binary code encoding of bit values, the LSB of a multi-level storage cell transitions between a binary zero and a binary one between the middle two abodes or states, the L1 state and the L2 state in the depicted embodiment.

For certain types of multi-level storage cells, the middle read voltage threshold 662*b* and the adjacent L1 and L2 states may be more sensitive to read disturb or other factors that can cause read voltages to drift. Further, as described above, in certain embodiments, the LSB and the MSB of a single multi-level storage cell may represent data stored in different physical pages. Using a single bit from each of a plurality of multi-level storage cell as a data set, in one embodiment, may reduce a number of read operations to retrieve the data set. In other embodiments, use of a single bit from each of a plurality of multi-level storage cells in the lower page simplifies a process of detecting a deviation and direction of a read bias from a known bias for multi-level storage cells.

In one embodiment, the read threshold management module 304 determines a direction of deviation for a grouping of multi-level storage cells based on a data set that includes data from one or more lower pages of the multi-level storage cells. Because the lower pages include the LSBs, in certain embodiments, the read threshold management module 304 determines that a read voltage threshold 662 deviates toward a larger read voltage in response to a difference between a read bias for the lower pages and a known bias for the lower pages indicating that storage cell values for the LSBs have transitioned from a binary one to a binary zero. For an LSB to transition from a binary one to a binary zero, a read voltage for a multi-level storage cell using the encoding model of FIG. 6A must drift from either an L0 or L1 abode to an L2 or L3 abode, indicating that one or more of the read voltage thresholds 662 should be increased, to place the read voltage back in the original L0 or L1 state.

Similarly, in certain embodiments, the read threshold management module 304 determines that a read voltage threshold 662 deviates toward a smaller read voltage in response to a difference between a read bias for the lower pages and a known bias for the lower pages indicating that storage cell values for the LSBs have transitioned from a binary zero to a binary one. For an LSB to transition from a binary zero to a binary one, a read voltage for a multi-level storage cell using the encoding model of FIG. 6A must drift from either an L3 or L2 state to an L1 or L0 state, indicating that one or more of the read voltage thresholds 662 should be decreased, to place the read voltage back in the original L3 or L2 state. In certain embodiments, a deviation across multiple states may be unlikely, and deviations detectable using LSBs may be between the L1 and L2 states, indicating a clear direction of deviation in either direction.

In another embodiment, the read threshold management module 304 determines a direction of deviation based at least partially on an encoding type used for storage cells of the non-volatile memory media 122, a physical and/or electrical architecture of the storage cells of the non-volatile memory media 122, or the like. For example, based on the encoding model of FIG. 6A, the read threshold management module 304 may determine a direction of deviation based on a 2-bit MLC media type, based on whether the data set includes an upper page or a lower page, based on the depicted Gray code encoding type, based on a magnitude of the determined deviation, or the like. In a further embodiment, the read threshold management module 304 may transform or combine LSBs and MSBs from separate or disparate addresses, such as different physical pages or the like, into a single data set or may otherwise coordinate LSBs and MSBs to determine a direction of deviation.

Using each bit stored in multi-level storage cells to determine a read voltage threshold adjustment, in certain embodiments, can increase the accuracy of the read voltage threshold adjustment, but may increase the number of read operations or add complexity to the determination. In one embodiment, if an ECC decoder detects a data error in an upper page of a grouping of multi-level storage cells, the read threshold management module 304 retrieves one or more lower pages for the grouping and adjusts a read voltage threshold for the grouping based on the lower pages.

Figure 6B:
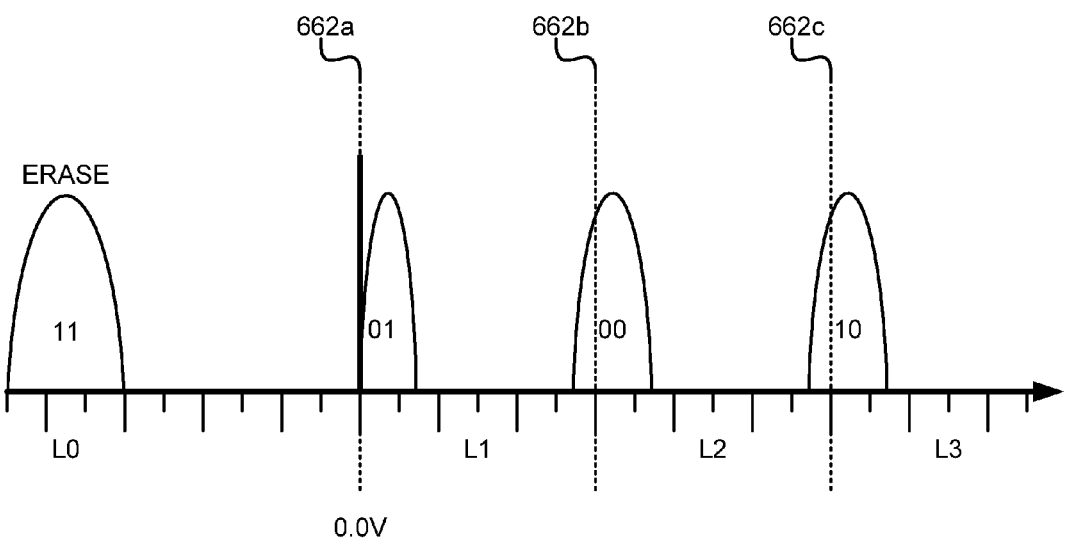
FIG. 6B is a diagram illustrating one embodiment of a set of multi-level storage cells according to a predefined condition.

FIG. 6B is a diagram illustrating one embodiment of distributions of stored read voltage levels of a set of multi-level storage cells. In FIG. 6B, the read voltages for a set of storage cells corresponding states L1, L2, and L3 have drifted to lower read voltage levels. This drift may be due to the host computing device 110 being powered off or unpowered for a period of time. After being powered off, non-volatile voltage cells may gradually lose a stored charge resulting in lower stored voltage levels as indicated in FIG. 6B. An amount of stored charge may vary depending on one or more of a length of time without power, a manufacturer, cell materials, an architecture, a physical cell geometry, or the like.

In one example, a distribution of read voltage levels associated with the L1 state may have drifted lower from a range of 0.1V to 0.2V, to a lower range of 0.0V to 0.75V. Although the read voltage levels may have drifted lower, they may still be within a L1 abode ranging from 0.0V to 0.3V. The distribution of read voltage levels associated with the L2 state may have drifted lower from a range of 0.4V to 0.5V to a lower range of 0.275V to 0.375V. In this example, one or more of the read voltage levels for the L2 state may have drifted outside of the L2 abode, causing bit errors. Therefore, the value read from a non-volatile storage cell that has drifted past the read voltage threshold 662*b* may result in a '01' value (associated with the L1 state) instead of a '00' value associated with the L2 state. This may cause data read errors, read retries, data inconsistencies, and other data problems. Also, the distribution of read voltage levels associated with the L3 state may have drifted lower from a range of 0.8V to 0.9V to a lower range of 0.575V to 0.675V.

In one embodiment, the status module 202 may detect that the host computing device 110 has been powered on after being powered down. The status module 202 may determine that non-volatile storage cells of the non-volatile memory media 122 satisfy a predefined condition of having been powered off. In response to the status module 202 determining that the predefined condition is satisfied, the read module 204 may perform one or more read operations for at least a subset of the non-volatile storage cells due to the voltage drift depicted in FIG. 6B. Performing one or more read operations on the non-volatile storage cells may increase the stored charge for the storage cells and increase the voltage to be within defined voltage range abodes L1, L2, L3. The read operations may increase the voltage levels similar to voltage levels depicted in FIG. 6A. Reading the storage cells may increase a stored voltage at the storage cells which may correct errors associated with the stored voltage level being low or outside of the defined voltage range abodes L1, L2, and L3, read voltage threshold values, or the like.

In certain embodiments, the effect of performing one or more read operations may be based on a geometry and/or an architecture of the non-volatile memory media 122 and its associated non-volatile storage cells. In some embodiments, based on the geometry and/or the architecture of the non-volatile storage cells, performing one or more read operations on the non-volatile storage cells may have a greater effect on voltages in certain abodes L0, L1, L2, L3 than others. For example, in one embodiment, performing one or more read operations may be more effective in correcting voltages that have drifted from abode L1 to abode L0 than in correcting voltages that have drifted from abode L3 to abode L2. Similarly, in another embodiment, performing one or more read operations may be more effective in correcting voltages that have drifted from abode L3 to abode L2 than in correcting voltages that have drifted from abode L2 to L1, or may have other differences in effectiveness based on a geometry and/or architecture of the non-volatile memory media 122.

Figure 6C:
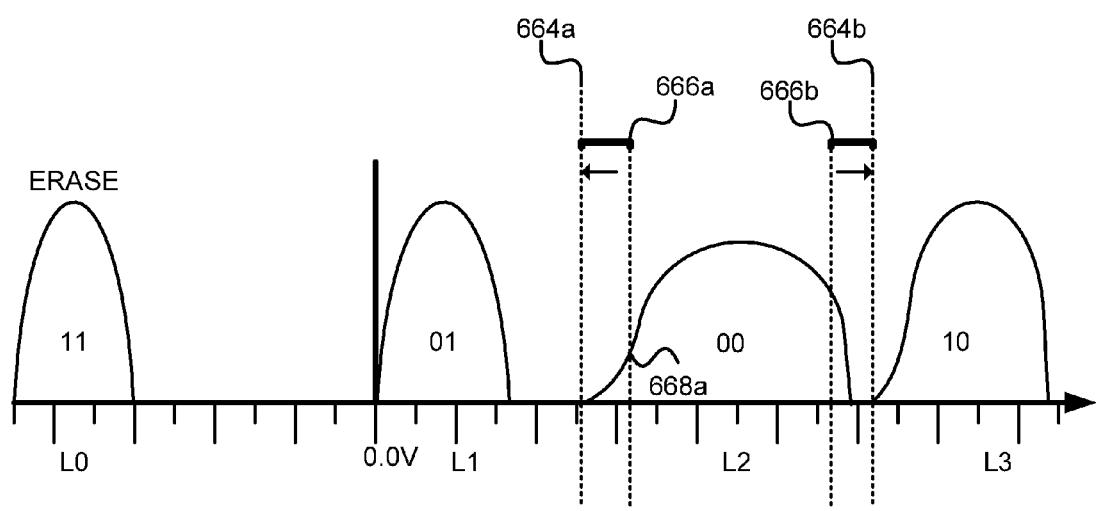
FIG. 6C is a diagram illustrating one embodiment of a set of multi-level storage cells according to a predefined condition.

FIG. 6C is a diagram illustrating one embodiment of adjusted read voltage thresholds 664 for a set of multi-level storage cells. In one embodiment, and as similarly described, storage cells of the non-volatile storage medium 122 may age, deteriorate, or suffer other environmental effects. The age, use, or environmental effects may affect stored read voltage levels of the non-volatile storage cells. In certain embodiments, stored read voltage levels may decrease or sag while the non-volatile memory device 120 is powered off.

Due to the effects described above, one or more stored read voltage levels for a set of non-volatile storage cells may drift past a read voltage threshold 666. For example, after being powered off or unpowered for a period of time, a stored state of '00' may sag or drift below a read threshold voltage level 664*a* into the L1 abode associated with a '01' or the like.

In one embodiment, the status module 202 may determine that a predefined condition has been satisfied, indicating that a read voltage level may have drifted or is sagging. In response to the status module 202 determining that the non-volatile storage cells satisfy a predefined condition, the read module 204 may perform one or more read operations on the non-volatile storage cells to increase the stored read voltage levels due to read disturb effects.

As described above, performing one or more read operations on storage cells, may increase a stored read voltage level (e.g., in adjacent or neighboring cells) so that the stored read voltage level is returned to its originally programmed abodes. In one embodiment, the read module 204 may perform one or more read operations periodically, at regular intervals, after a predefined retention time threshold has been met, or the like. For example, the read module 204 may perform one or more read operations on sagging storage cells every week, or more frequently, or less frequently based, at least in part, on the state of the memory media 122.

In other embodiment, the read threshold management module 304, in cooperation with the read module 204, determines and manages read voltage thresholds 666, 664 or other configuration parameters individually for one or more of the abodes L0, L1, L2, L3, determining different settings or adjustments to configuration parameters in different abodes L0, L1, L2, L3. In one embodiment, the read threshold management module 304 adjusts one or more read voltage thresholds 664 based, at least in part, on an age, a use threshold, an error count, or other environmental effect. For example, the read threshold management module 304 may decrease a read voltage threshold value from 666*a* to 664*a* to increase the L2 abode to accommodate sagging read voltage levels, may increase a read voltage threshold value from 666*b* to 664*b* to accommodate increasing read voltage levels, or the like.

Figure 7:
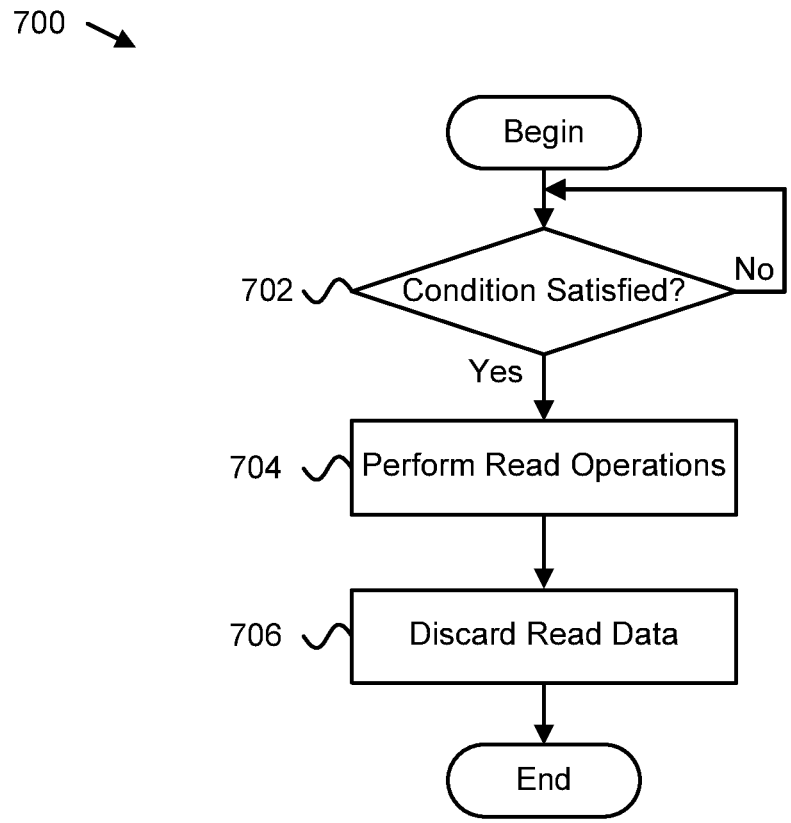
FIG. 7 is a schematic flow chart diagram illustrating one embodiment of a method for a read operation for a non-volatile memory.

FIG. 7 is a schematic flow chart diagram illustrating one embodiment of a method 700 for a read operation for a non-volatile memory. The method 700 begins and the status module 202 determines 702 whether one or more non-volatile storage cells satisfy a predefined condition. If the predefined condition is satisfied, the read module 204 performs 704 one or more read operations for the one or more non-volatile storage cells in response to the status module 202 determining 702 that the predefined condition is satisfied. The read result module 206 may disregard 706 data from the one or more read operations, and the method 700 ends.

Figure 8:
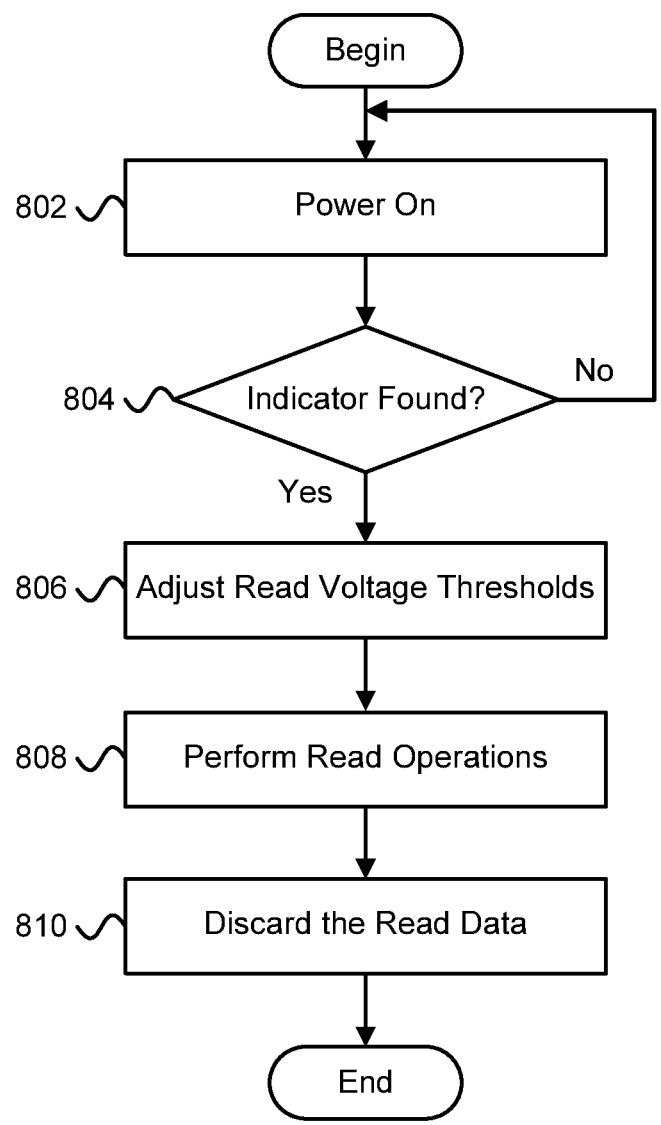
FIG. 8 is a schematic flow chart diagram illustrating another embodiment of a method for a read operation for a non-volatile memory.

FIG. 8 is a schematic flow chart diagram illustrating another embodiment of a method for a read operation for a non-volatile memory. The method 800 may begin and the status module 202 may determine 802 that the computing device 110 is powered on. The status module 202 may determine if an indicator is found 804 in metadata 135 for the computing device 110. If the status module 202 does not find the indicator in the metadata 135, the status module 202 may wait to detect another power state change for the computing device 110. If the status module 200 does find the indicator in the metadata 135, the read threshold management module 304 may adjust 806 one or more read voltage thresholds. The read module 204 may perform 808 one or more read operations on at least one page of a non-volatile recording device. The read result module 206 may discard 810 the data from the read operations and the method may end.

Figure 9:
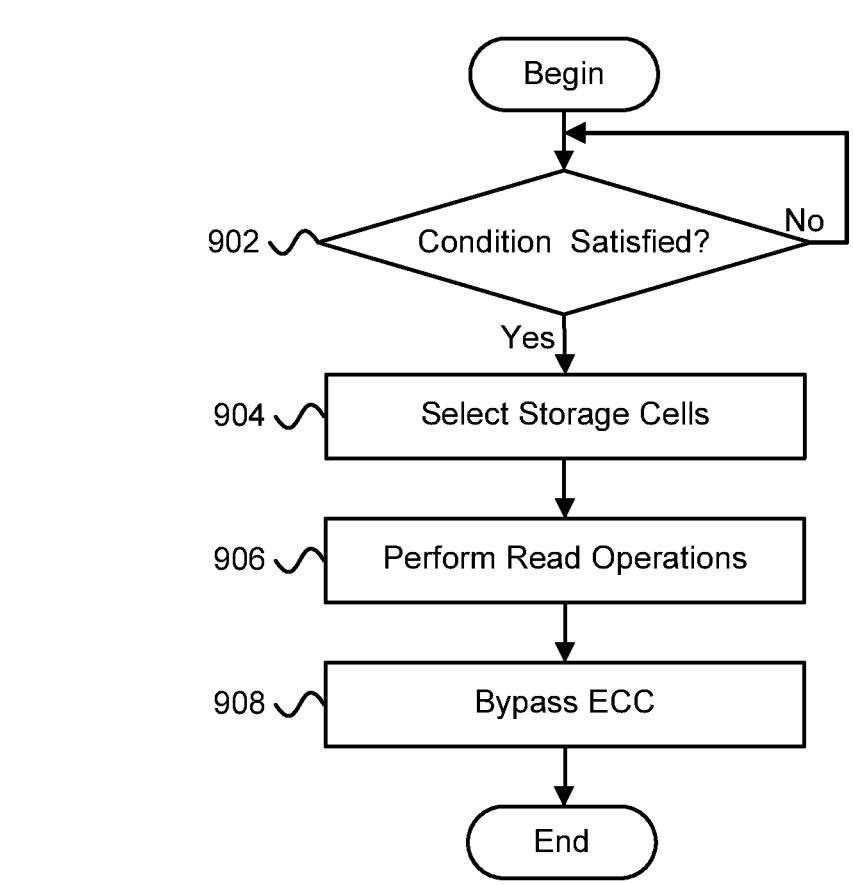
FIG. 9 is a schematic flow chart diagram illustrating a further embodiment of a method for a read operation for a non-volatile memory.

FIG. 9 is a schematic flow chart diagram illustrating a further embodiment of a method for a read operation for a non-volatile memory. The method may being and the status module 202 may determine if a predefined condition is satisfied for one or more storage cells of the non-volatile memory media 122. If the predefined condition is satisfied 902, the target module 302 may select 904 a page of the non-volatile recording device for performing one or more read operations. The read module 204 may perform 906 one or more read operations on at least one page of a non-volatile recording device. The read result module 206 may discard 908 the data from the read operations and bypass an error-correcting code decoder for the data and the method 900 may end.

A means for determining whether one or more non-volatile memory cells satisfy a retention condition, in various embodiment, may include the read operation module 150, the status module 202, the non-volatile memory controller 124, the SML 130, the non-volatile memory media controller 126, other logic hardware, and/or other executable code stored on a computer readable storage medium. Other embodiments may include similar or equivalent means for determining whether one or more non-volatile memory cells satisfy a retention condition.

A means for performing one or more read operations for the one or more memory cells in response to determining that the retention condition is satisfied, in various embodiment, may include the read operation module 150, the read module 204, the non-volatile memory controller 124, the SML 130, the non-volatile memory media controller 126, other logic hardware, and/or other executable code stored on a computer readable storage medium. Other embodiments may include similar or equivalent means for performing one or more read operations for the one or more memory cells.

A means for bypassing an error-correcting code (ECC) decoder for data of the one or more read operations, in various embodiments, may include the read operation module 150, the read result module 206, the non-volatile memory controller 124, the SML 130, the non-volatile memory media controller 126, other logic hardware, and/or other executable code stored on a computer readable storage medium. Other embodiments may include similar or equivalent means for bypassing an error-correcting code (ECC) decoder for data of the one or more read operations.

A means for selecting one or more storage cells based on one or more of a page architecture for the non-volatile memory cells, an addressing scheme for the non-volatile memory cells, and a physical cell geometry for the non-volatile memory cells, in various embodiment, may include the read operation module 150, the target module 302, the non-volatile memory controller 124, the SML 130, the non-volatile memory media controller 126, and/or other executable code stored on a computer readable storage medium. Other embodiments may include similar or equivalent means for selecting one or more storage cells based on one or more of a page architecture for the non-volatile memory cells, an addressing scheme for the non-volatile memory cells, and a physical cell geometry for the non-volatile memory cells.

A means for discarding the data of the one or more read operations by one or more of ignoring the data, interrupting transmission of the data, deleting the data from a memory buffer, and overwriting the data in a memory buffer, in various embodiments, may include the read operation module 150, the read result module 206, the non-volatile memory controller 124, the SML 130, the non-volatile memory media controller 126, and/or other executable code stored on a computer readable storage medium. Other embodiments may include similar or equivalent means for discarding the data of the one or more read operations by one or more of ignoring the data, interrupting transmission of the data, deleting the data from a memory buffer, and overwriting the data in a memory buffer.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
   determining that one or more non-volatile storage cells satisfy a predefined condition comprising one or more of the one or more non-volatile storage cells being unpowered for at least a predefined period of time, a power down for the one or more non-volatile storage cells, a power up for the one or more non-volatile storage cells, a temperature threshold, a partially written erase block condition, and an error rate for the one or more non-volatile storage cells satisfying a threshold; and
   preparing the one or more non-volatile storage cells for use prior to satisfying a read request from a storage client using the one or more non-volatile storage cells in response to determining the one or more non-volatile storage cells satisfy the predefined condition.

2. The method of claim 1, wherein preparing the one or more non-volatile storage cells comprises adjusting a stored voltage level of the one or more non-volatile storage cells.

3. The method of claim 2, wherein the stored voltage level of the one or more non-volatile storage cells is adjusted by performing one or more read operations which disturb the stored voltage level of the one or more non-volatile storage cells.

4. The method of claim 3, wherein the one or more read operations are performed on one or more target storage cells adjacent to the one or more non-volatile storage cells such that the stored voltage level of the one or more non-volatile storage cells is adjusted in response to the one or more read operations.

5. The method of claim 3, further comprising discarding data from the one or more read operations, wherein discarding the data comprises one or more of ignoring the data, interrupting transmission of the data, deleting the data from a memory buffer, overwriting the data in a memory buffer, and bypassing an error-correcting code (ECC) decoder for the data.

6. The method of claim 3, further comprising adjusting one or more read voltage thresholds for the one or more non-volatile storage cells.

7. The method of claim 6, wherein the predefined condition comprises a target read voltage threshold being between default read voltage threshold adjustment levels for the one or more non-volatile storage cells.

8. The method of claim 1, wherein the predefined condition is associated with a decrease in a stored voltage level of the one or more non-volatile storage cells.

9. The method of claim 1, wherein the one or more non-volatile storage cells comprise one or more pages of an erase block and the predefined condition comprises only a subset of the erase block being programmed prior to being powered down, the one or more pages comprising at least a last programmed page of the erase block.

10. The method of claim 9, further comprising selecting the one or more storage cells based on an indicator indicating that only the subset of the erase block was programmed prior to being powered down.

11. The method of claim 9, further comprising selecting the one or more storage cells in response to scanning the erase block to determine that only the subset of the erase block was programmed prior to being powered down.

12. An apparatus comprising:
   a status module configured to detect that a non-volatile recording device is powered on after being powered down;
   a read module configured to perform one or more read operations on at least one page of the non-volatile recording device without transmitting data from the one or more read operations to a storage client, the read module performing the one or more read operations in response to the status module determining that the non-volatile recording device is powered on; and
   a read result module configured to disregard the data from the one or more read operations by one or more of ignoring the data, interrupting transmission of the data, deleting the data from a read buffer, overwriting the data in a read buffer, and bypassing an error-correcting code (ECC) decoder for the read data.

13. The apparatus of claim 12, further comprising a target module configured to select the at least one page of the non-volatile recording device for performing the one or more read operations based on one or more of a page architecture for the non-volatile recording device, an addressing scheme for the non-volatile recording device, and a physical cell geometry for the non-volatile recording device.

14. The apparatus of claim 12, further comprising a read threshold management module configured to adjust one or more read voltage thresholds for the at least one page in response to the non-volatile recording device being powered on, the one or more read operations of the read module configured to adjust one or more stored read voltage levels of the at least one page relative to the adjusted one or more read voltage thresholds.

15. The apparatus of claim 12, wherein the read module is configured to select the at least one page from an erase block, the erase block being partially programmed with data prior to the non-volatile recording device being powered down.

* * * * *